(12) United States Patent
Chiu et al.

(10) Patent No.: US 9,818,729 B1
(45) Date of Patent: Nov. 14, 2017

(54) PACKAGE-ON-PACKAGE STRUCTURE AND METHOD

(71) Applicant: Taiwan Semiconductor Manufacturing Company, Ltd., Hsin-Chu (TW)

(72) Inventors: Sheng-Hsiang Chiu, Tainan (TW); Meng-Tse Chen, Changzhi Township (TW); Ching-Hua Hsieh, Hsin-Chu (TW); Chung-Shi Liu, Hsin-Chu (TW); Sheng-Feng Weng, Taichung (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/184,843

(22) Filed: Jun. 16, 2016

(51) Int. Cl.
| | |
|---|---|
| *H01L 23/48* | (2006.01) |
| *H01L 25/065* | (2006.01) |
| *H01L 25/00* | (2006.01) |
| *H01L 21/56* | (2006.01) |
| *H01L 21/3105* | (2006.01) |
| *H01L 23/00* | (2006.01) |
| *H01L 21/768* | (2006.01) |

(Continued)

(52) U.S. Cl.
CPC .... *H01L 25/0657* (2013.01); *H01L 21/31053* (2013.01); *H01L 21/565* (2013.01); *H01L 21/6835* (2013.01); *H01L 21/76877* (2013.01); *H01L 21/78* (2013.01); *H01L 23/528* (2013.01); *H01L 23/5226* (2013.01); *H01L 24/03* (2013.01); *H01L 24/06* (2013.01); *H01L 24/11* (2013.01); *H01L 24/14* (2013.01); *H01L 25/50* (2013.01); *H01L 2224/0231* (2013.01); *H01L 2224/02331* (2013.01); *H01L 2224/02373* (2013.01); *H01L 2224/03002* (2013.01); *H01L 2224/0401* (2013.01); *H01L 2224/11002* (2013.01); *H01L 2225/06548* (2013.01)

(58) Field of Classification Search
CPC ... H01L 25/0657; H01L 25/50; H01L 21/565; H01L 21/31053; H01L 24/06; H01L 24/03
See application file for complete search history.

(56) References Cited

U.S. PATENT DOCUMENTS

| | | | |
|---|---|---|---|
| 2010/0025837 A1* | 2/2010 | Shinoda | H01L 25/0657 257/686 |
| 2010/0072593 A1* | 3/2010 | Kim | H01L 21/563 257/676 |

(Continued)

*Primary Examiner* — A. Sefer
(74) *Attorney, Agent, or Firm* — Slater Matsil, LLP

(57) ABSTRACT

A method includes attaching a first semiconductor package on a carrier, wherein the first semiconductor package comprises a plurality of stacked semiconductor dies and a plurality of contact pads, depositing a first molding compound layer over the carrier, wherein the first semiconductor package is embedded in the first molding compound layer, forming a plurality of vias over the plurality of contact pads, attaching a semiconductor die on the first molding compound layer, depositing a second molding compound layer over the carrier, wherein the semiconductor die and the plurality of vias are embedded in the second molding compound layer, forming an interconnect structure over the second molding compound layer and forming a plurality of bumps over the interconnect structure.

20 Claims, 28 Drawing Sheets

(51) Int. Cl.
    *H01L 21/683*     (2006.01)
    *H01L 23/528*     (2006.01)
    *H01L 23/522*     (2006.01)
    *H01L 21/78*     (2006.01)

(56) References Cited

U.S. PATENT DOCUMENTS

| | | | |
|---|---|---|---|
| 2011/0068481 A1* | 3/2011 | Park | H01L 23/3128 257/777 |
| 2013/0037950 A1* | 2/2013 | Yu | H01L 23/49816 257/738 |
| 2013/0168856 A1* | 7/2013 | Wang | H01L 25/105 257/738 |
| 2013/0168865 A1* | 7/2013 | Watanabe | H01L 23/522 257/758 |
| 2014/0264842 A1* | 9/2014 | Lin | H01L 23/49816 257/737 |
| 2015/0155243 A1* | 6/2015 | Chen | H01L 23/562 257/724 |

* cited by examiner

PACKAGE-ON-PACKAGE STRUCTURE AND METHOD

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for miniaturization, higher speed and greater bandwidth, as well as lower power consumption and latency has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package-on-package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package-on-package semiconductor devices. Furthermore, package-on-package semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
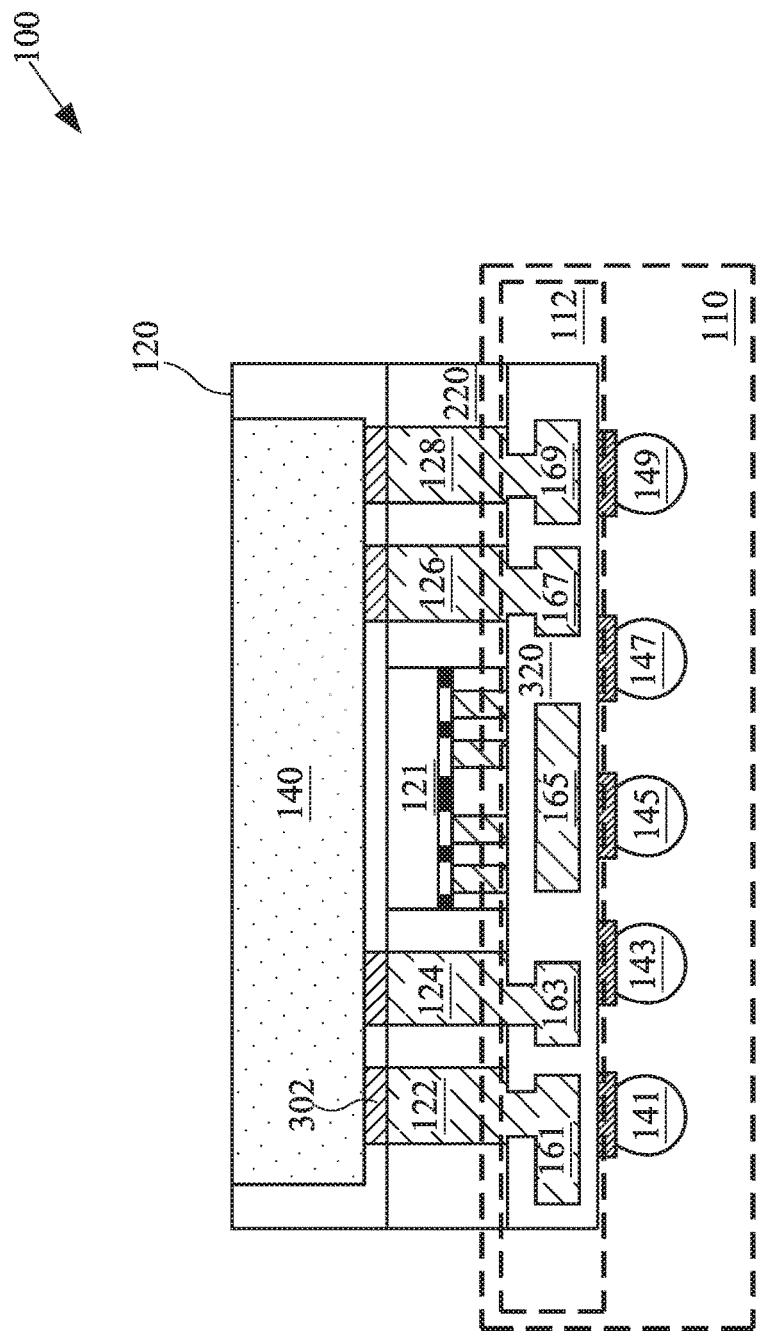
FIG. 1 illustrates a cross sectional view of a package-on-package semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a fabrication process of forming a package-on-package structure. The embodiments of the disclosure may also be applied, however, to a variety of package-on-package structures. Hereinafter, various embodiments will be explained in detail with reference to the accompanying drawings.

FIG. 1 illustrates a cross sectional view of a package-on-package semiconductor device in accordance with various embodiments of the present disclosure. The package-on-package semiconductor device 100 includes a bottom package 110, a top package 140 and a semiconductor die 121 between the top package 140 and the bottom package 110. In particular, the top package 140 is stacked on top of the bottom package 110. The semiconductor die 121 is in a molding compound layer.

The top package 140 is in a first molding compound layer 120. As shown in FIG. 1, a top surface of the top package 140 is level with a top surface of the first molding compound layer 120. The top package 140 comprises a plurality of contact pads such as contact pad 302. The bottom surfaces of the contact pads are level with a bottom surface of the first molding compound layer 120.

Furthermore, the package-on-package semiconductor device 100 comprises a second molding compound layer 220 between the bottom package 110 and the top package 140. In addition, a plurality of through vias 122, 124, 126 and 128 are embedded in and extend through the second molding compound layer 220. As shown in FIG. 1, a bottom surface of each through via (e.g., through via 122) is connected to a redistribution line (e.g., redistribution line 161) through a via formed on the redistribution line. A top surface of each through via (e.g., through via 122) is connected to a contact pad (e.g., contact pad 302) of the top package 140. In some embodiments, the width of the through via 122 is equal to the width of the contact pad 302. The through vias 122, 124, 126 and 128 are formed of suitable conductive materials such as copper and/or the like.

As shown in FIG. 1, through vias 122 and 124 are on the left side of the semiconductor die 121. Through vias 126 and 128 are on the right side of the semiconductor die 121. In some embodiments, the height of the through vias 122-128 is equal to the height of the semiconductor die 121.

The bottom package 110 comprises a plurality of bumps 141, 143, 145, 147 and 149, and an interconnect structure 112. The interconnect structure 112 comprises a plurality of redistribution lines 161, 163, 165, 167 and 169 as shown in FIG. 1. As shown in FIG. 1, the redistribution lines 161, 163, 165, 167 and 169 are embedded in a dielectric layer 320. In some embodiments, the redistribution lines (e.g., redistribution line 161) may be connected to the through vias (e.g., through via 122) through an interconnect via.

It should be noted that the structure of the interconnect structure 112 shown in FIG. 1 is merely an example. A person skilled in the art would recognize many variations, alternatives, and modifications. For example, the redistribution lines 161, 163, 167 and 169 may be connected to their respective through vias 122, 124, 126 and 128 directly.

It should further be noted that the number of the redistribution lines (e.g., redistribution lines 161-169) shown in FIG. 1 is merely examples. A person skilled in the art would recognize many variations, alternatives, and modifications. For example, the interconnect structure 112 could comprise more than one interconnect layer and each interconnect layer may accommodate any number of redistribution lines.

Since bumps 141-149 are formed on the bottom package 110, bumps 141-149 are alternatively referred to as the bottom package bumps 141-149 throughout the description. The plurality of bottom package bumps 141, 143, 145, 147 and 149 are formed over the interconnect structure 112 of the bottom package 110. In some embodiments, the bottom package bumps 141, 143, 145, 147 and 149 are solder balls. There may be a plurality of under bump metallization (UBM) structures formed underneath their respective bottom package bumps. The detailed formation processes of the bottom package bumps 141, 143, 145, 147 and 149 and their respective UBM structures will be described below with respect to FIG. 11.

It should be noted that the numbers of bottom package bumps (e.g., bumps 141-149) and through vias (e.g., through vias 122-128 shown in FIG. 1 are merely examples. A person skilled in the art would recognize many variations, alternatives, and modifications. For example, the bottom package 110 could accommodate any number of bumps.

One advantageous feature of the package-on-package semiconductor device 100 shown in FIG. 1 is that the package-on-package semiconductor device is thinner than the conventional package-on-package semiconductor device because the package-on-package semiconductor device shown in FIG. 1 does not include solder bumps between the top package and the bottom package. Furthermore, the electrical performance of the package-on-package semiconductor device shown in FIG. 1 may be improved by removing the solder bumps between the top package and the bottom package.

Another advantageous feature of the package-on-package semiconductor device 100 shown in FIG. 1 is that the underfill layer can be saved because the semiconductor die 121 has a first surface in direct contact with the first molding compound layer 120 and a second surface in direct contact with the dielectric layer 320. The structure configuration of the semiconductor die 121 shown in FIG. 1 does not need a dispensing process for forming an underfill layer to support the semiconductor die 121.

FIGS. 2-13 illustrate intermediate steps of fabricating the package-on-package semiconductor device shown in FIG. 1 in accordance with various embodiments of the present disclosure. It should be noted that the fabrication steps as well as the package-on-package structure shown in FIGS. 2-13 are merely an example. A person skilled in the art will recognize there may be many alternatives, variations and modifications.

Figure 2:
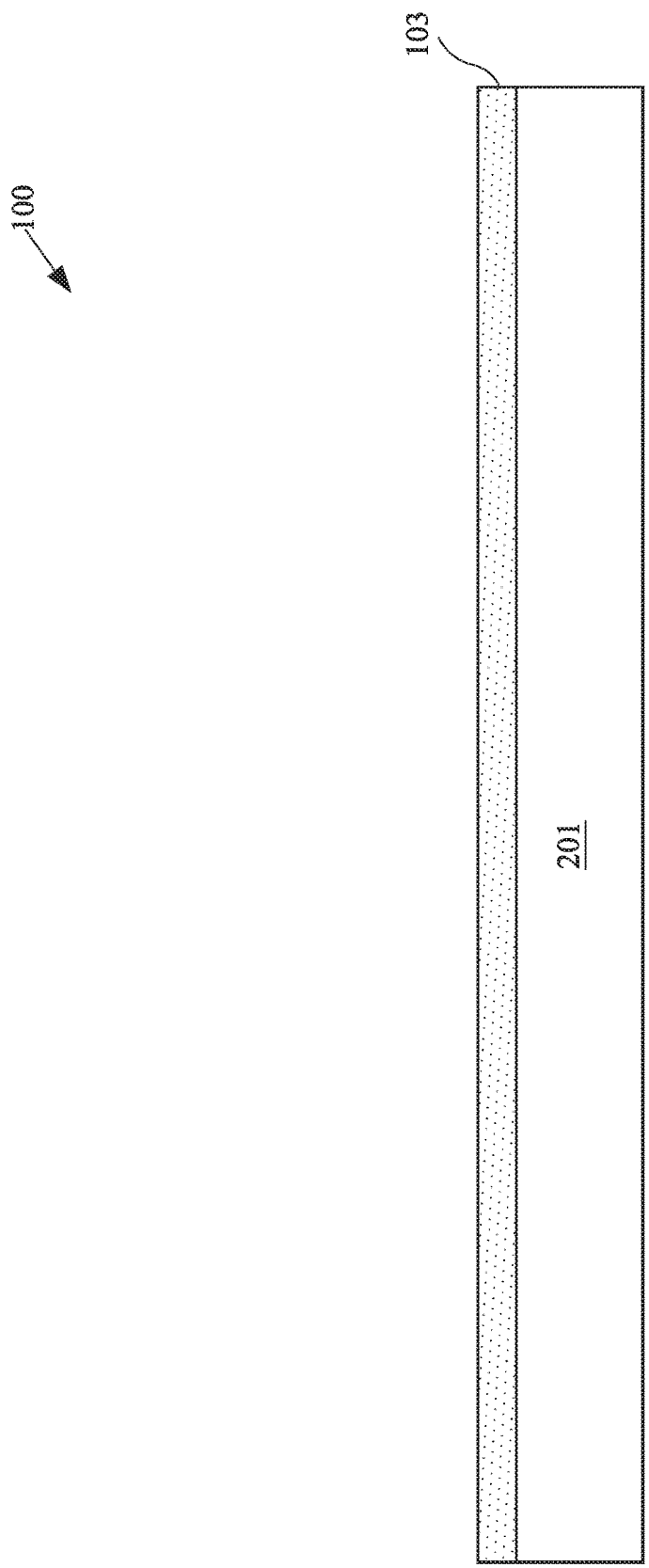
FIGS. 2-13 illustrate intermediate steps of fabricating the package-on-package semiconductor device shown in FIG. 1 in accordance with various embodiments of the present disclosure.

FIG. 2 illustrates a cross sectional view of a semiconductor device in accordance with various embodiments of the present disclosure. As shown in FIG. 2, a release layer 103 is formed on a carrier 201. The carrier 201 may be formed of silicon, glass, ceramic aluminum oxide, silicon oxide, a combination thereof, and/or the like. In some embodiments, the release layer 103 is formed of an epoxy-based thermal-release material. In alternative embodiments, the release layer 103 may be formed of an ultra-violet (UV) glue, which loses its adhesive property when exposed to UV lights.

The release layer 103 may be formed over the carrier 201 by any suitable semiconductor fabrication techniques. In some embodiments, the release layer 103 may be dispensed as a liquid and cured subsequently. In alternative embodiments, release layer 103 may be laminated onto carrier 201.

Figure 3:
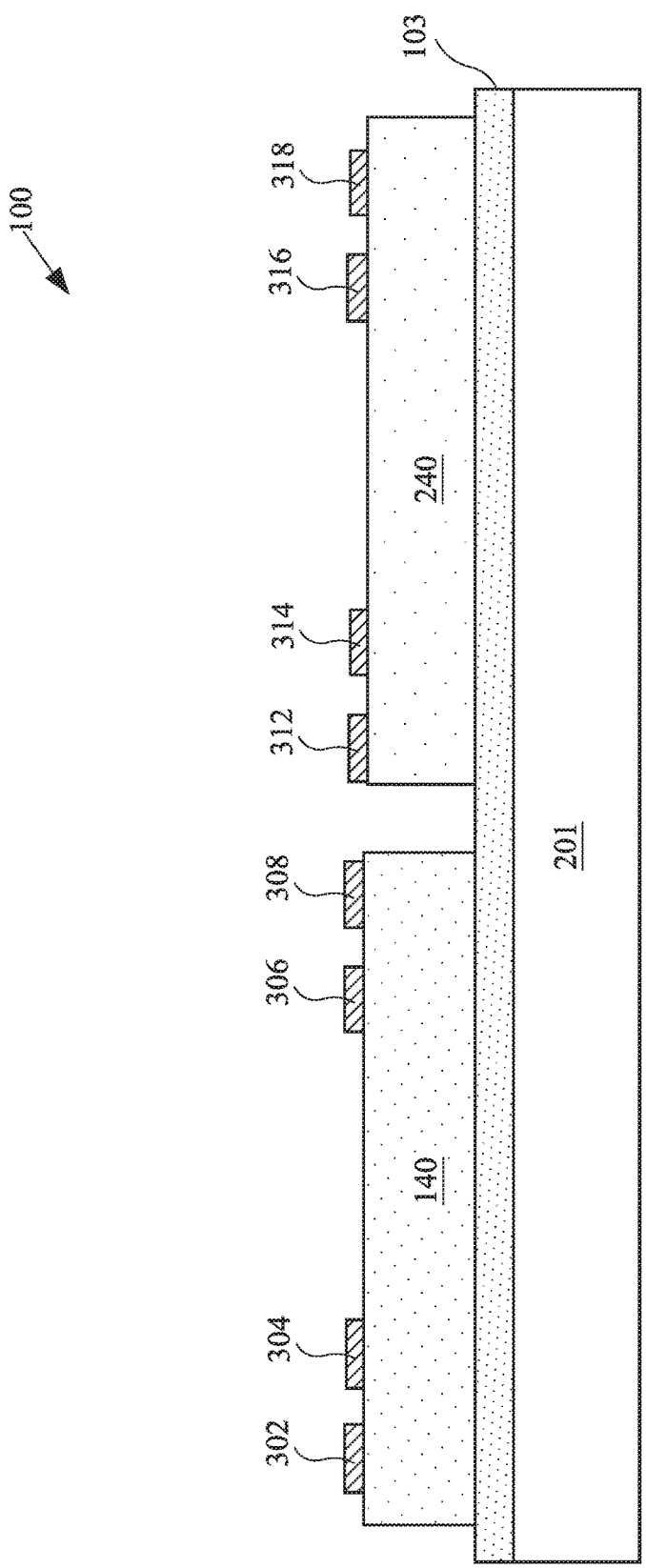

FIG. 3 illustrates a cross sectional view of the semiconductor device shown in FIG. 2 after a first top package and a second top package are mounted on the carrier in accordance with various embodiments of the present disclosure. The first top package 140 and the second top package 240 are picked and placed on the carrier 201 as shown in FIG. 3. Both the first top package 140 and the second top package 240 comprise a plurality of contact pads. As shown in FIG. 3, the first top package 140 comprises contact pads 302, 304, 306 and 308 formed on a top side of the first top package 140. The second top package 240 comprises contact pads 312, 314, 316 and 318 formed on a top side of the second top package 240. As shown in FIG. 3, the bottom sides of the first top package 140 and the second top package 240 are in direct contact with the top surface of the release layer 103.

The first top package 140 and the second top package 240 may comprise a plurality of stacked dies (not shown), which may be wire bonded to the input and output terminals of the top packages. The stacked dies of the top packages 140 and 240 may comprise memory dies, logic dies, processor dies, any combinations thereof and/or the like. In some embodiments, the top packages 140 and 240 comprise a plurality of dynamic random-access memory (DRAM) semiconductor devices.

It should be noted that while FIG. 3 illustrates two top packages attached on the release layer 103, the carrier 201 may accommodate any number of top packages. It should further be noted that FIG. 3 illustrates the contact pads 302-308 and 312-318 protrude over the top surfaces of the top packages 140 and 240 respectively. The contact pads illustrated in FIG. 3 are merely an example, which should not unduly limit the scope of the claims. One of ordinary skill in the art would recognize many variations, alternatives, and modifications. For example, the contact pads (e.g., contact pad 302) may be embedded in the top packages (e.g., first top package 140).

Figure 4:
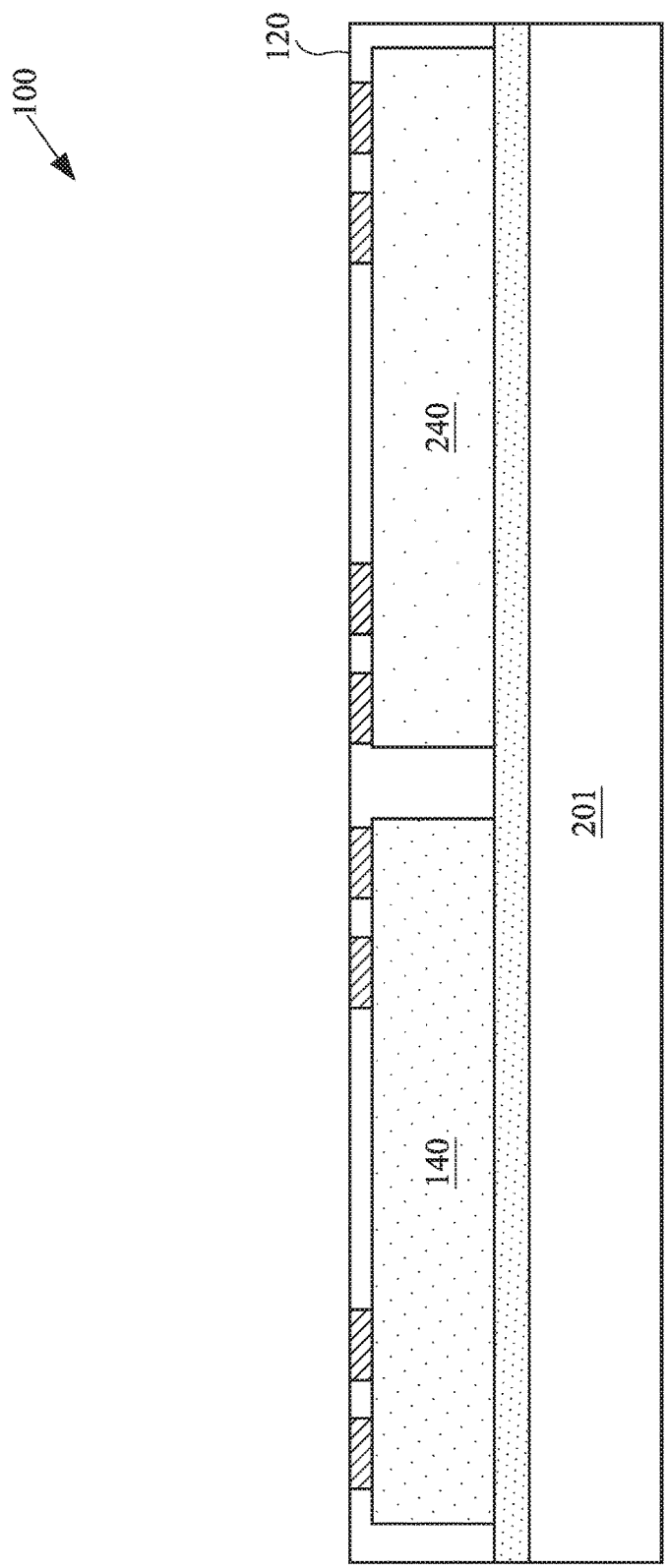

FIG. 4 illustrates a cross sectional view of the semiconductor device shown in FIG. 3 after a first molding compound layer is formed over the semiconductor device in accordance with various embodiments of the present disclosure. The first molding compound layer 120 may fill the gaps between the top packages 140 and 240. In some embodiments, an expose molding process is employed to form the first molding compound layer 120. As a result of performing the expose molding process, no grinding is needed. The top surface of the first molding compound layer 120 is level with the top surfaces of the contact pads after the expose molding process finishes.

Figure 5:
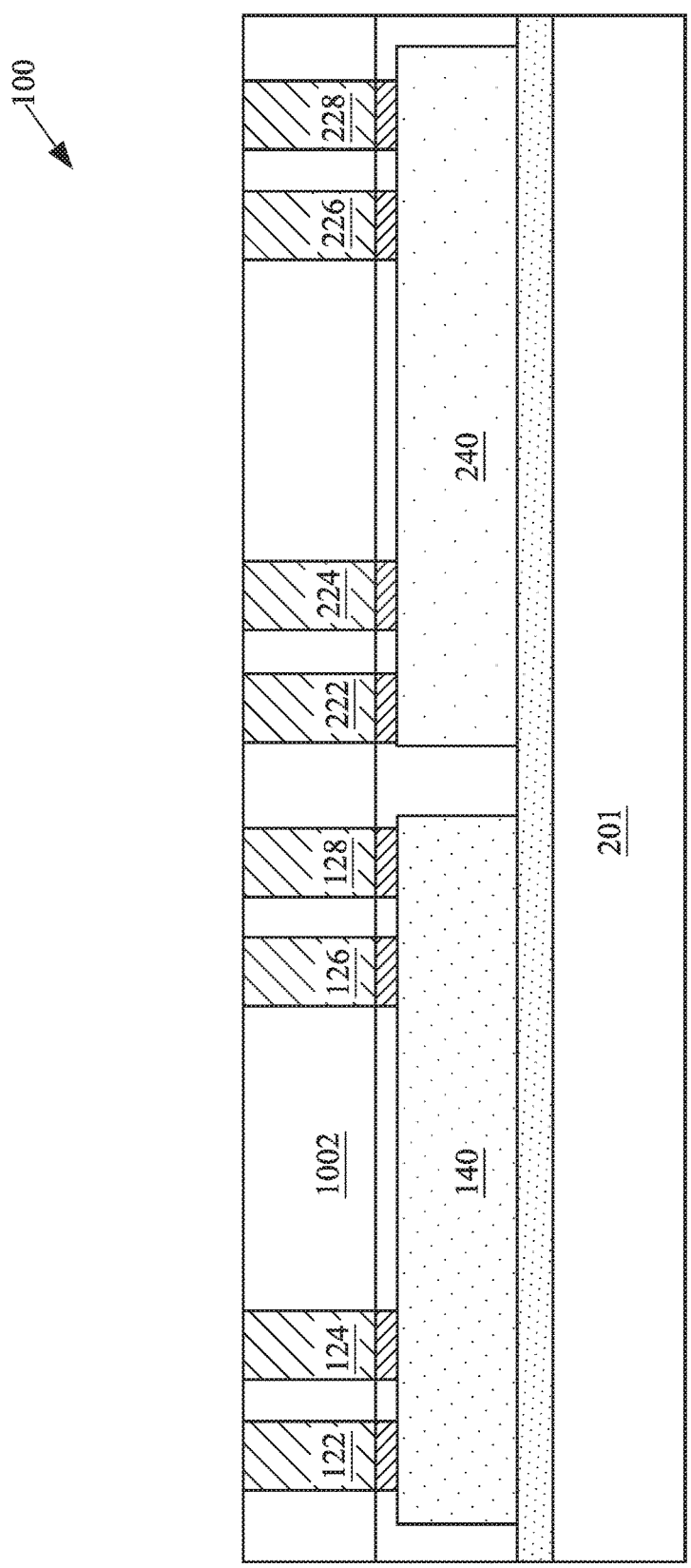

FIG. 5 illustrates a cross sectional view of the semiconductor device shown in FIG. 4 after a plurality of vias have been formed in accordance with various embodiments of the present disclosure. A photoresist layer 1002 is formed over the first molding compound layer 120. In accordance with some embodiments, the photoresist layer 1002 may be formed of suitable photoresist materials such as SU-8 photo-sensitive epoxy, film type polymer materials and/or the like. The photoresist layer 1002 may be formed by suitable semiconductor fabrication techniques such as spin coating and/or the like.

Once the photoresist layer 1002 is formed, a patterning process is applied to the photoresist layer 1002. In consideration of the location of through vias 122, 124, 126 and 128 shown in FIG. 1, selective areas of the photoresist layer 1002 are exposed to light. As a result, a variety of openings (not shown) are formed in the photoresist layer 1002. The formation of the openings in the photoresist layer 1002 involves lithography operations, which are well known, and hence are not discussed in further detail herein to avoid unnecessary repetition.

The openings in the photoresist layer 1002 may be filled with a conductive material. The conductive material may comprise copper, although other suitable materials such as aluminum, alloys, tungsten, silver, doped polysilicon, combinations thereof, and/or the like, may alternatively be utilized.

In some embodiments, the openings may be filled with the conductive material by a plating process. Once the plating process finishes, a planarization process such as a chemical mechanical polish (CMP) process may be performed to remove excess portions of the conductive material. More particularly, the CMP process is applied to the conductive material over the photoresist layer 1002 until the top surface of the photoresist layer 1002 is exposed. After the CMP process finishes, a plurality of vias 122, 124, 126, 128, 222, 224, 226 and 228 are formed in the photoresist layer 1002.

Figure 6:
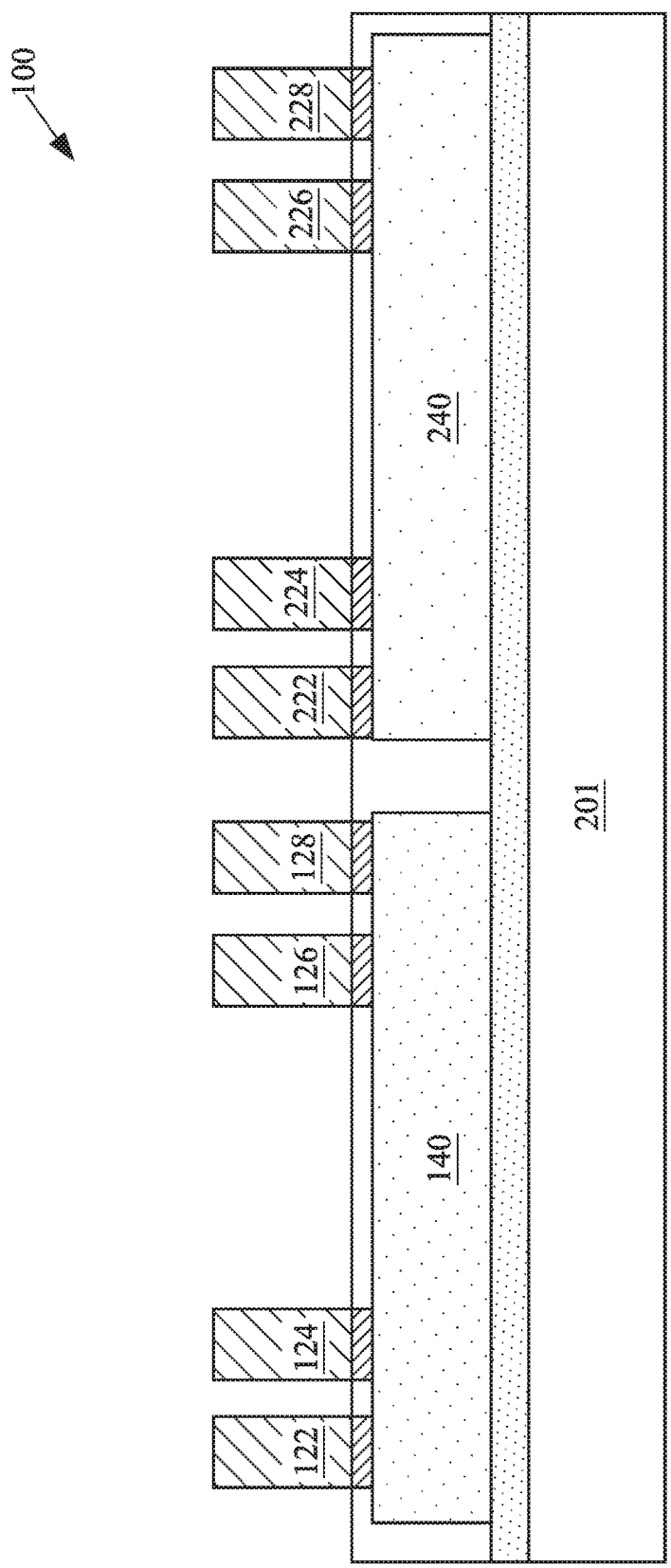

FIG. 6 illustrates a cross sectional view of the semiconductor device shown in FIG. 5 after the remaining photoresist layer has been removed in accordance with various embodiments of the present disclosure. In some embodiments, the remaining photoresist layer 1002 shown in FIG. 5 may be removed by using suitable photoresist stripping techniques such as chemical solvent cleaning, plasma ashing, dry stripping and/or the like. The photoresist stripping techniques are well known and hence are not discussed in further detail herein to avoid unnecessary repetition.

Figure 7:
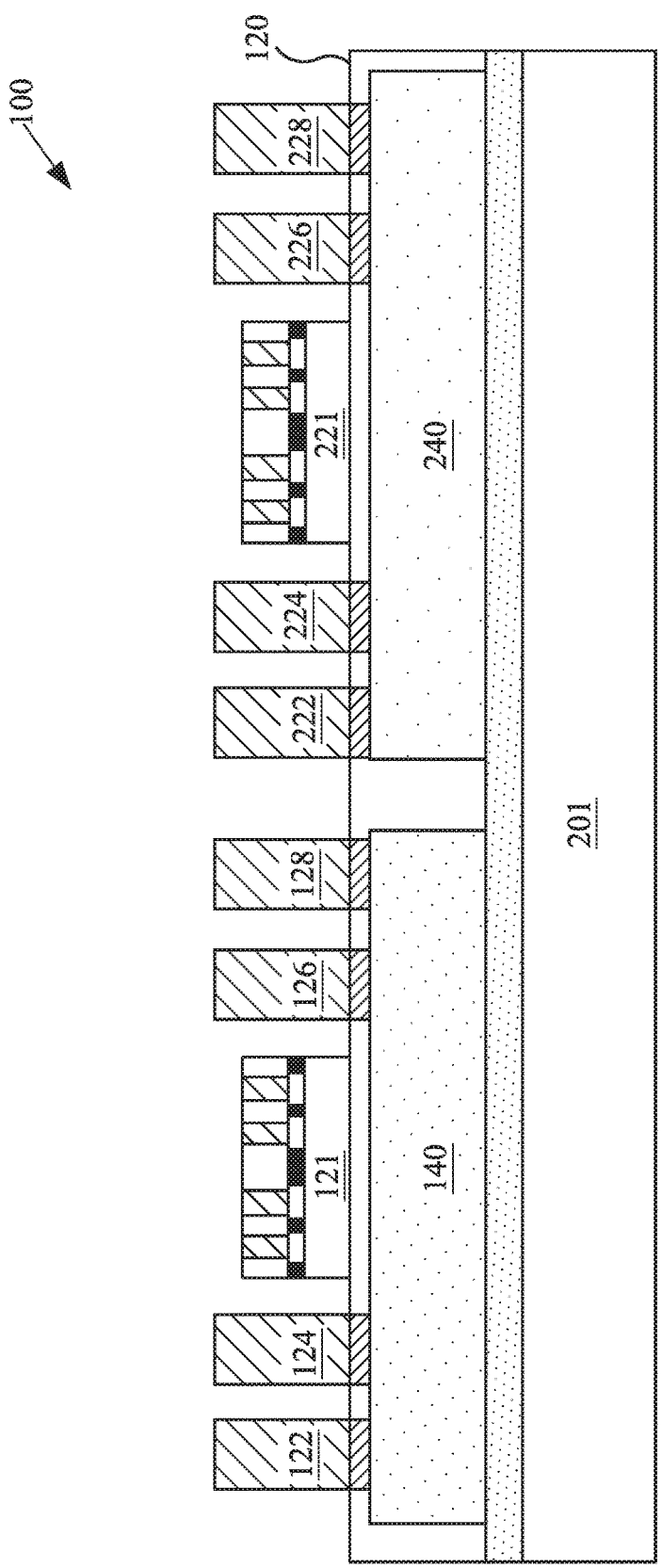

FIG. 7 illustrates a cross sectional view of the semiconductor device shown in FIG. 6 after a first semiconductor die and a second semiconductor die are mounted on the first molding compound layer in accordance with various embodiments of the present disclosure. Both the first semiconductor die 121 and the second semiconductor die 221 comprise a substrate and a plurality of interconnect structures formed over the substrate. The first semiconductor die 121 and the second semiconductor die 221 are picked and placed on the first molding compound layer 120 as shown in FIG. 7. In particular, the substrate sides of the first semiconductor die 121 and the second semiconductor die 221 are in direct contact with the top surface of the first molding compound layer 120. In alternative embodiments, the substrate sides of the first semiconductor die 121 and the second semiconductor die 221 are bonded on the first molding compound layer 120 through an adhesive layer (not shown).

It should be noted that while FIG. 7 illustrates two semiconductor dies bonded on the first molding compound layer 120, the first molding compound layer 120 may accommodate any number of semiconductor dies. It should further be noted that FIG. 7 illustrates the top surfaces of the semiconductor dies 121 and 221 are lower than the top surfaces of the through vias (e.g., through via 122). The height of the semiconductor dies 121 and 221 illustrated in FIG. 7 is merely an example, which should not unduly limit the scope of the claims. One of ordinary skill in the art would recognize many variations, alternatives, and modifications. For example, the top surfaces of the through vias (e.g., through via 122) may be level with the top surfaces of the semiconductor dies 121 and 221.

Figure 8:
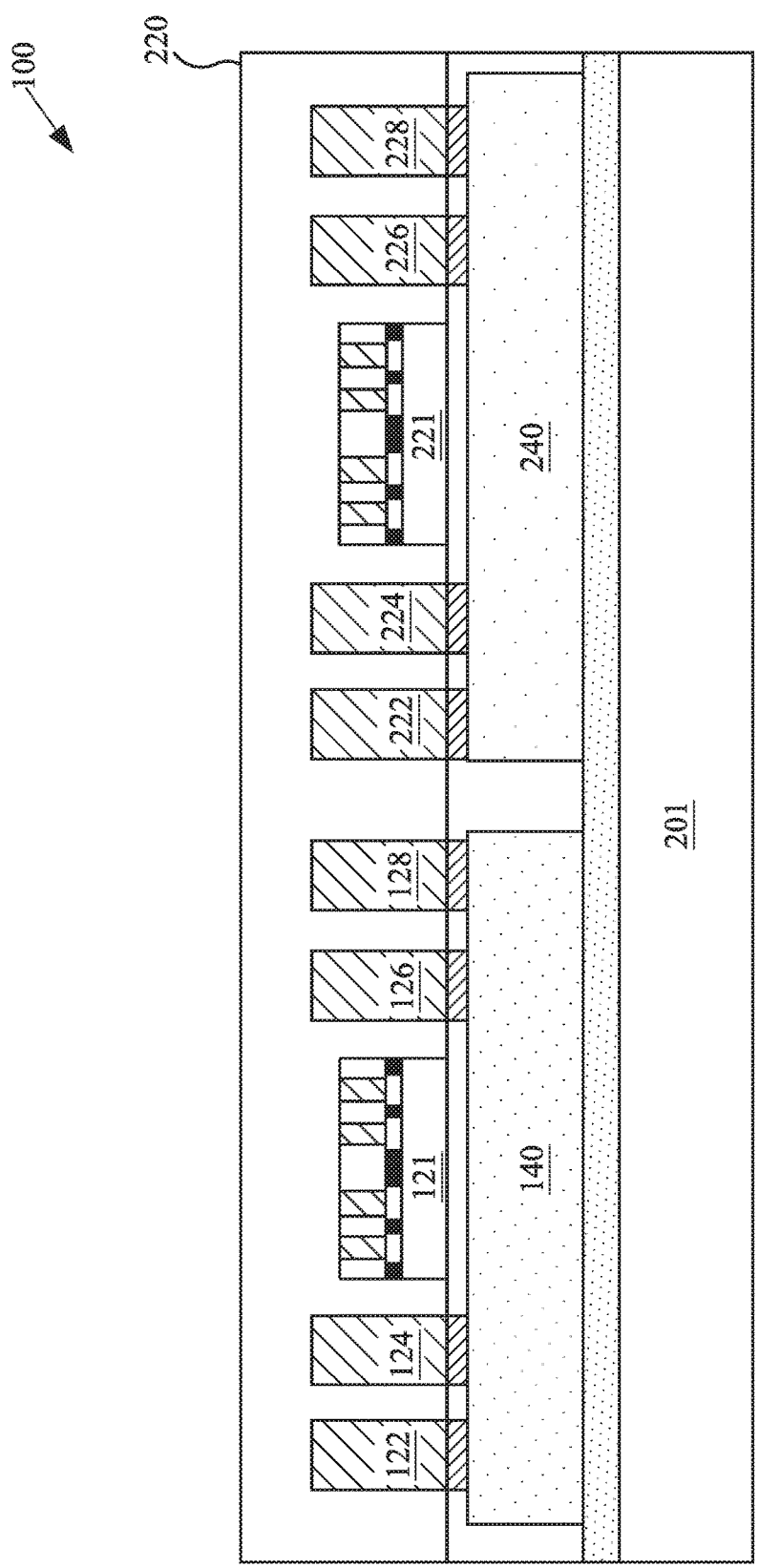

FIG. 8 illustrates a cross sectional view of the semiconductor device shown in FIG. 7 after a second molding compound layer is formed over the first molding compound layer in accordance with various embodiments of the present disclosure. The second molding compound layer 220 may fill the gaps between the semiconductor dies and the adjacent through vias (e.g., through via 124 and semiconductor die 121) as well as the gap between two adjacent through vias (e.g., through vias 122 and 124). As shown in FIG. 8, the through vias 122-128, 222-228, and the semiconductor dies 121 and 221 are embedded in the second molding compound layer 220.

In some embodiments, the second molding compound layer 220 may be an epoxy, which is dispensed at the gaps described above. The epoxy may be applied in a liquid form, and may harden after a curing process. In alternative embodiments, the second molding compound layer 220 may be formed of curable materials such as polymer based materials, resin based materials, polyimide, epoxy and any combinations of thereof. The second molding compound layer 220 can be formed by any suitable dispense techniques.

Figure 9:
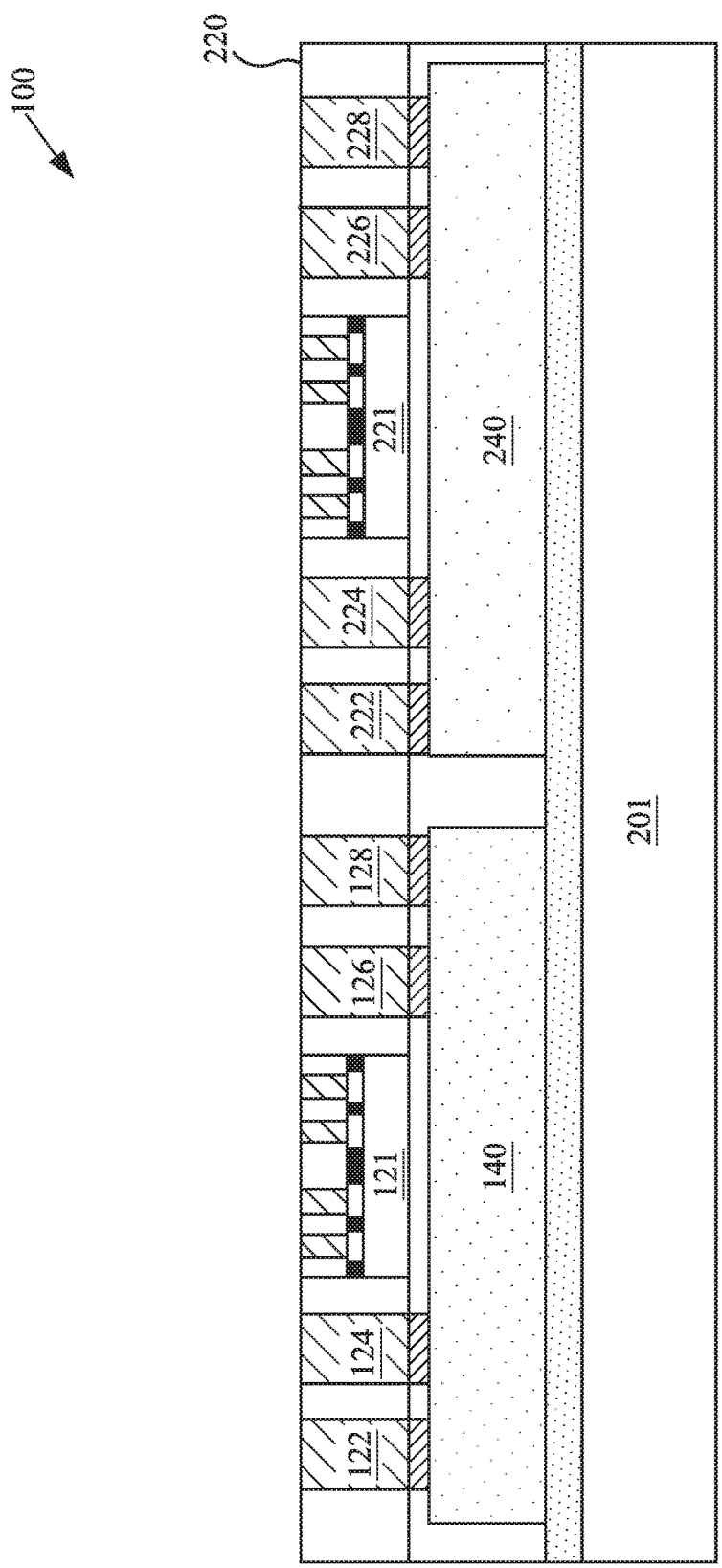

FIG. 9 illustrates a cross sectional view of the semiconductor device shown in FIG. 8 after a grinding process is applied to the top surface of the second molding compound layer in accordance with various embodiments of the present disclosure. The top surface of the second molding compound layer 220 undergoes a grinding process. The grinding process can employ a mechanical grinding process, a chemical polishing process, an etching process, any combinations thereof and/or the like.

As shown in FIG. 9, the grinding process is applied to the top surface of the second molding compound layer 220 until the top surfaces of the through vias (e.g., through via 122) and the semiconductor dies become exposed. In particular, as shown in FIG. 9, the top surface of the interconnect sides of the semiconductor dies 121 and 221 may be exposed outside the second molding compound layer 220. As a result of performing the grinding process, the top surfaces of the through vias are level with the top surfaces of the interconnect sides of the semiconductor dies 121 and 221.

Figure 10:
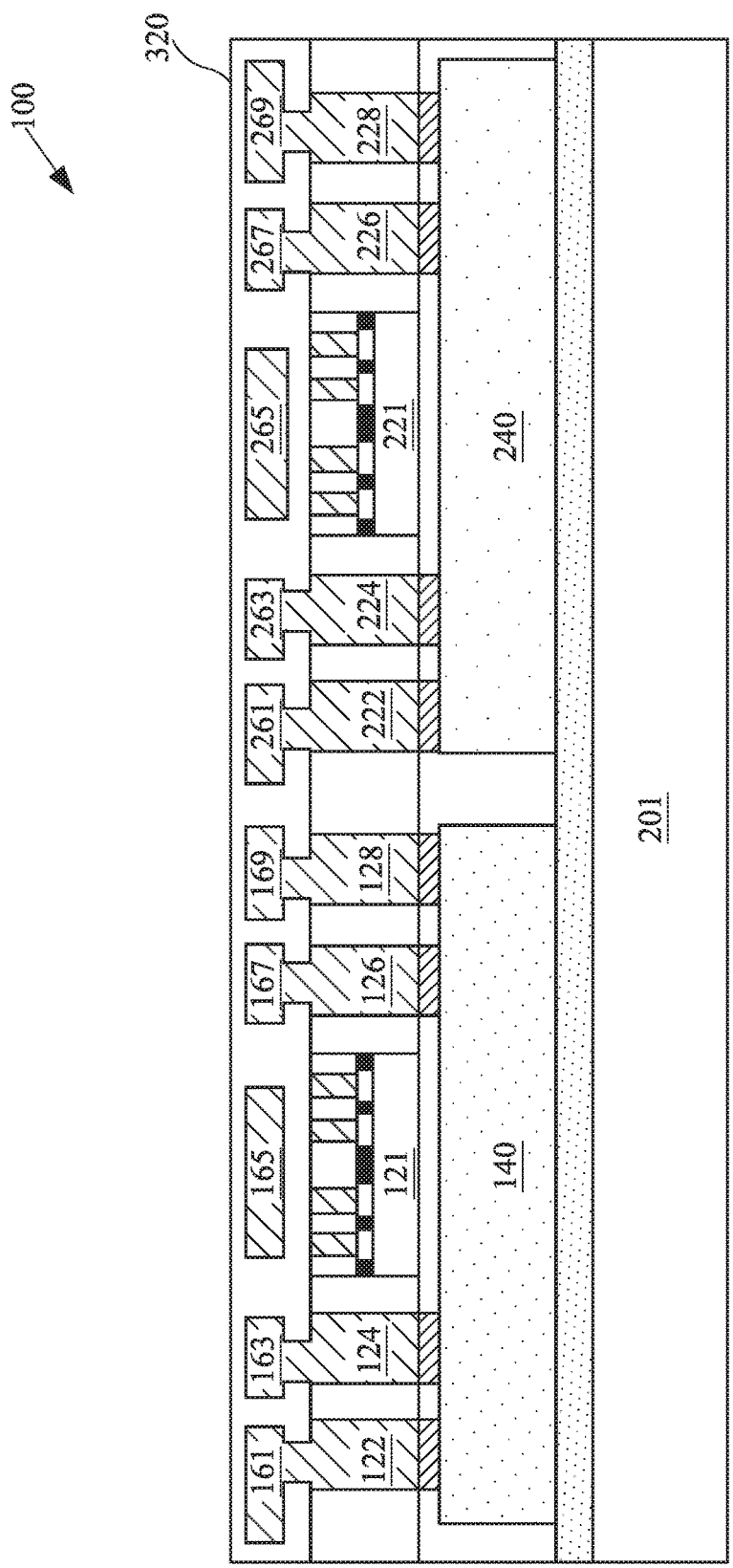

FIG. 10 illustrates a cross sectional view of the semiconductor device shown in FIG. 9 after an interconnect structure has been formed over the carrier in accordance with various embodiments of the present disclosure. As shown in FIG. 10, a plurality of redistribution lines 161, 163, 165, 167, 169, 261, 263, 265, 267 and 269 are formed in a dielectric layer 320.

The dielectric layer 320 may be alternatively referred to as an inter-layer dielectric (ILD) layer 320 hereinafter. In some embodiments, the ILD layer 320 is formed of a photo-sensitive material such as polybenzoxazole (PBO), polyimide, benzocyclobutene (BCB), any combinations thereof and/or the like, which may be easily patterned using a lithography mask. In alternative embodiments, the ILD layer 320 may be formed of a nitride such as silicon nitride, an oxide such as silicon oxide, phosphosilicate glass (PSG), borosilicate glass (BSG), boron-doped phosphosilicate glass (BPSG), any combinations thereof and/or the like. The ILD layer 320 may be formed by suitable fabrication techniques such as such as spinning, chemical vapor deposition (CVD), and plasma enhanced CVD (PECVD) and/or the like.

In some embodiments, the redistribution lines (e.g., redistribution line 161) may be connected to their respective interconnect vias formed between the redistribution lines and the through vias (e.g., through via 122). Alternatively, the top surfaces of the redistribution lines may be exposed. The exposed portions of the redistribution lines may be connected to the through vias directly. The redistribution lines may be formed of suitable conductive materials such as aluminum, aluminum alloys, copper or copper alloys and the like.

The redistribution lines 161-169 and 261-269 may be a single material layer, or a multi-layered structure and may be made of metals such as titanium, titanium nitride, aluminum, tantalum, copper and combinations thereof. The redistribution lines 161-169 and 261-269 may be made by any suitable method known in the art such as physical vapor deposition (PVD), sputter, CVD, electroplating and/or the like.

Figure 11:
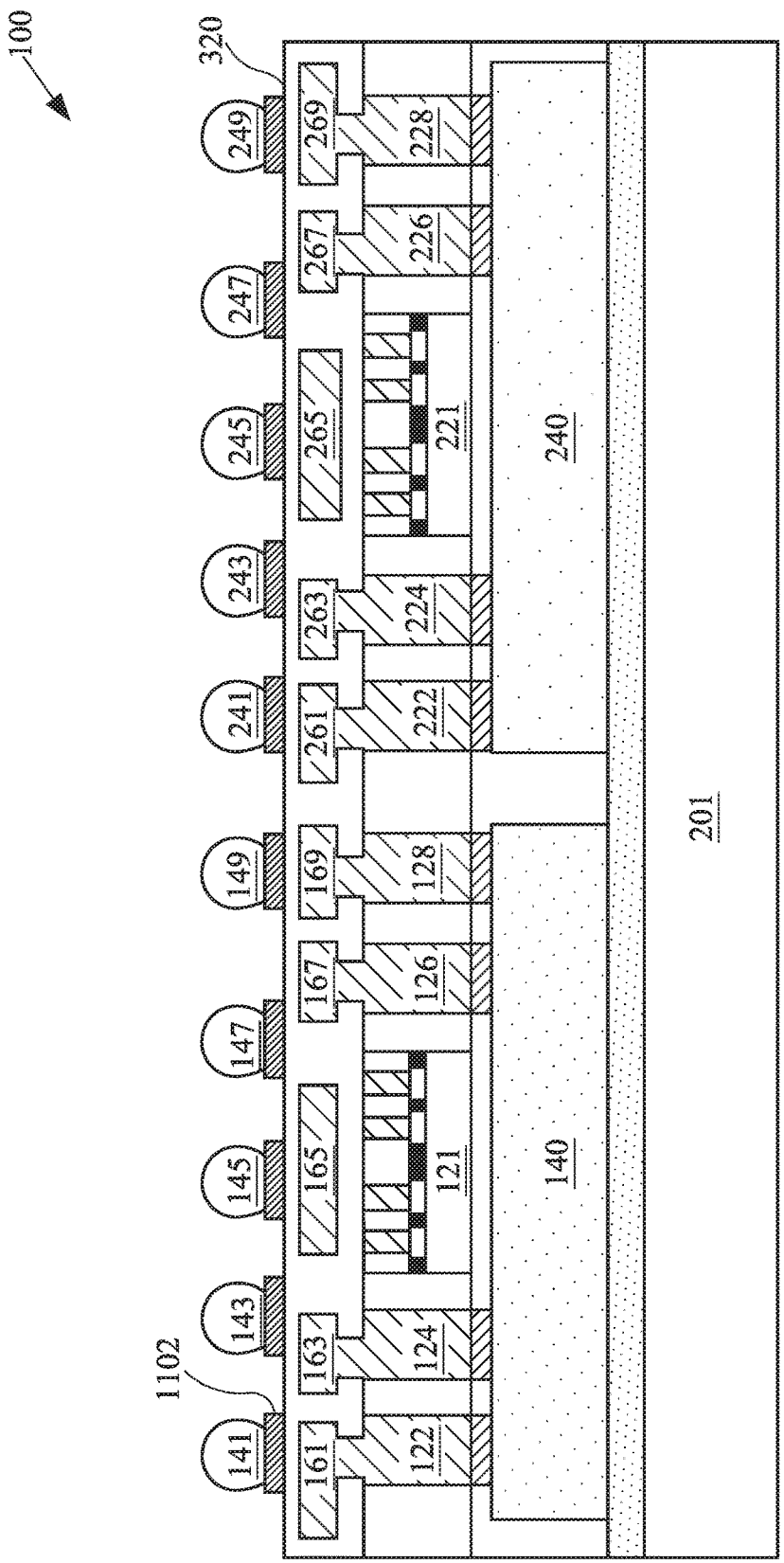

FIG. 11 illustrates a cross sectional view of the semiconductor device shown in FIG. 10 after a plurality of bumps are formed over the front side redistribution lines in accordance with various embodiments of the present disclosure. A plurality of UBM structures (e.g., UBM 1102) and their respective bumps are formed over the dielectric layer 320 as shown in FIG. 11. The UBM structures 1102 help to prevent diffusion between the solder balls and the integrated circuits of the semiconductor device, while providing a low resistance electrical connection.

In some embodiments, the bumps 141, 143, 145, 147, 149, 241, 243, 245, 247 and 249 are solder balls. In some embodiments, the solder balls may comprise SAC405. SAC405 comprises 95.5% Sn, 4.0% Ag and 0.5% Cu.

Figure 12:
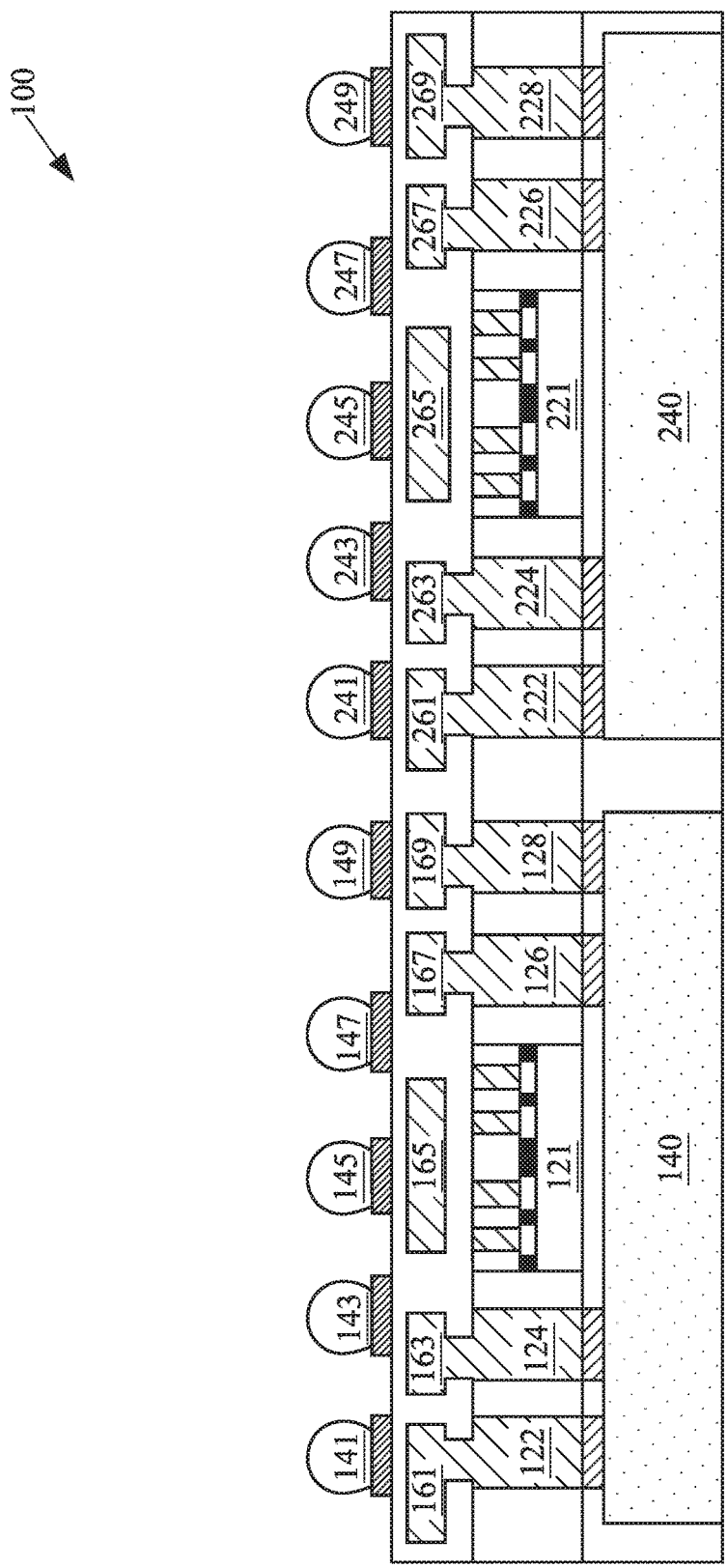

FIG. 12 illustrates a cross sectional view after a process of removing the carrier has been applied to the package-on-package semiconductor device 100 in accordance with various embodiments of the present disclosure. The carrier 201 shown in FIG. 11 can be detached from the package-on-package semiconductor device 100. A variety of detaching processes may be employed to separate the package-on-package semiconductor device 100 from the carrier 201. The variety of detaching processes may comprise a chemical solvent, a UV exposure and the like. The release layer 103 may be removed from the package-on-package semiconductor device 100 by using a suitable etching process.

Figure 13:
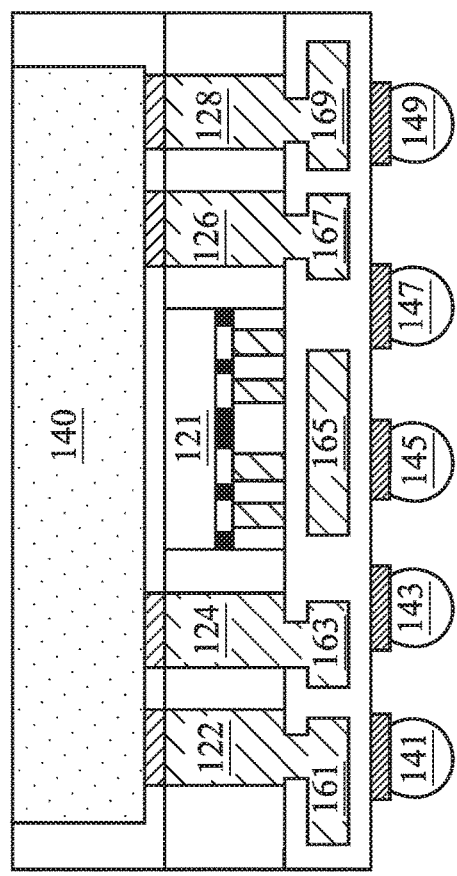

FIG. 13 illustrates a cross sectional view of the semiconductor device shown in FIG. 12 after a dicing process is applied to the semiconductor device in accordance with various embodiments of the present disclosure. A suitable dicing process may be employed to cut the package-on-package semiconductor device 100 shown in FIG. 12 into individual chip packages. The dicing process is well known in the art, and hence is not discussed in detail herein to avoid repetition.

Figure 14:
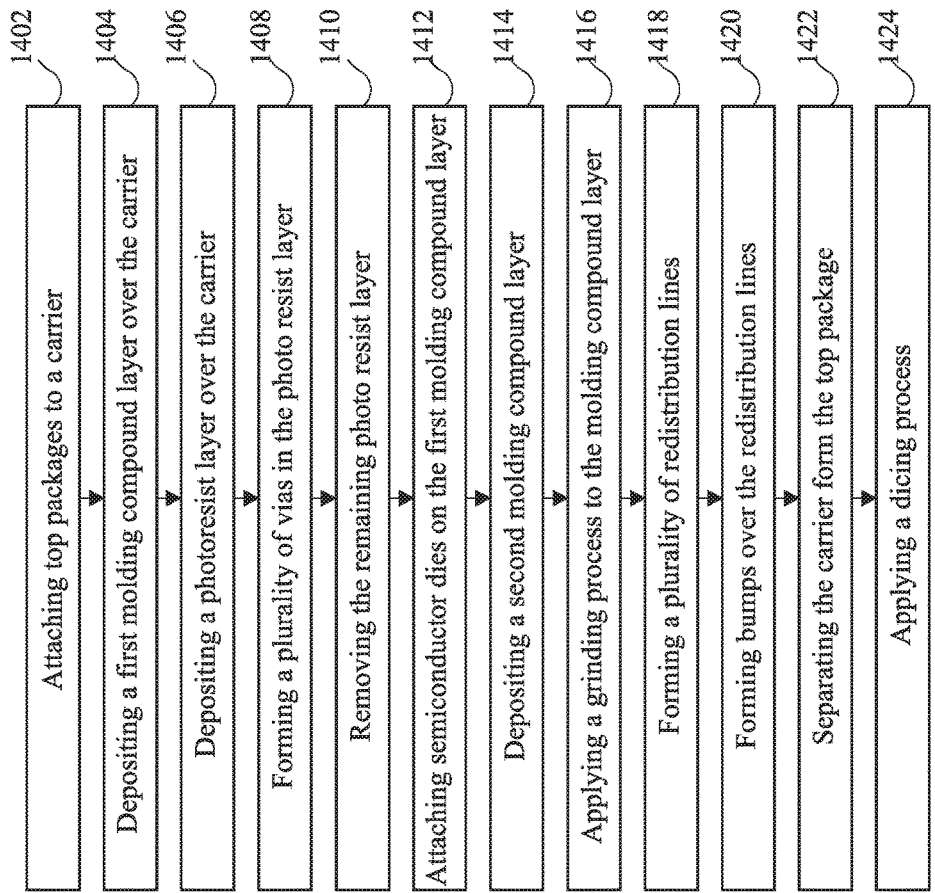
FIG. 14 illustrates a flow chart of a method for forming the semiconductor device shown in FIG. 1 in accordance with various embodiments of the present disclosure.

FIG. 14 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 14 may added, removed, replaced, rearranged and repeated.

At step 1402, a first top package and a second top package are attached to a carrier through a release layer. The top packages have a plurality of contact pads formed on the top surfaces of the top packages. The bottom surfaces of the top packages are in direct contact with the release layer.

At step 1404, a first molding compound layer is formed over the carrier. The first top package and the second top package are embedded in the first molding compound layer. More particular, the first molding compound layer is formed by using an expose molding process. After the expose molding process finishes, the top surface of the molding compound layer is level with the top surfaces of the contact pads of the top packages.

At step 1406, a photoresist layer is deposited over the first molding compound layer. At step 1408, a patterning process is applied to the photoresist layer. As a result, a plurality of openings may be formed in the photoresist layer. Through a plating process, a conductive material is filled in the openings to form a plurality of through vias embedded in the photoresist layer. At step 1410, the remaining photoresist layer may be removed through a suitable photoresist stripping process.

At step 1412, a first semiconductor die and a second semiconductor die are attached to the first molding compound layer. In particular, the substrate sides of the first semiconductor die and the second semiconductor die are bonded on the first molding compound layer. At step 1414, a second molding compound layer is formed over the first molding compound layer. The through vias and the semiconductor dies are embedded in the second molding compound layer.

At step 1416, a grinding process is applied to the second molding compound layer until the top surfaces of the semiconductor dies are level with the top surfaces of the through vias. At step 1418, a plurality of redistribution lines are formed in a dielectric layer and over the top surface of the second molding compound layer.

At step 1420, a plurality of UBM structures are formed over the redistribution lines. A plurality of bumps are formed over their respective UBM structures. At step 1422, a suitable carrier removal technique is employed to separate the carrier from the semiconductor device.

At step 1424, a suitable dicing process is employed to divide the semiconductor device into two package-on-package structures.

FIGS. 15-27 illustrate intermediate steps of fabricating another package-on-package semiconductor device in accordance with various embodiments of the present disclosure. The steps of fabricating a semiconductor device 200 shown in FIGS. 15, 18, 20 and 22-27 are similar to those shown in FIGS. 2, 4, 6 and 8-13, and hence are not discussed in detail herein to avoid repetition.

Figure 15:
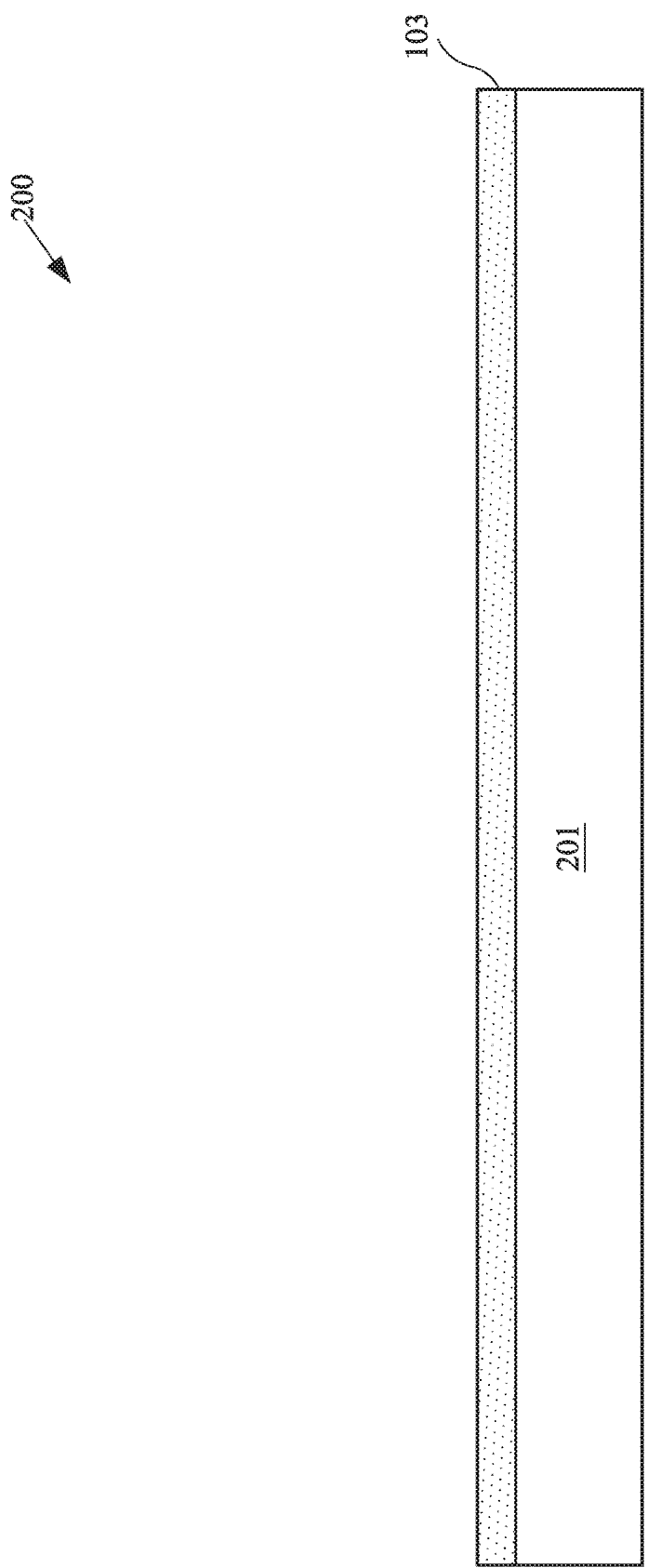
FIGS. 15-27 illustrate intermediate steps of fabricating another package-on-package semiconductor device in accordance with various embodiments of the present disclosure.
Figure 16:
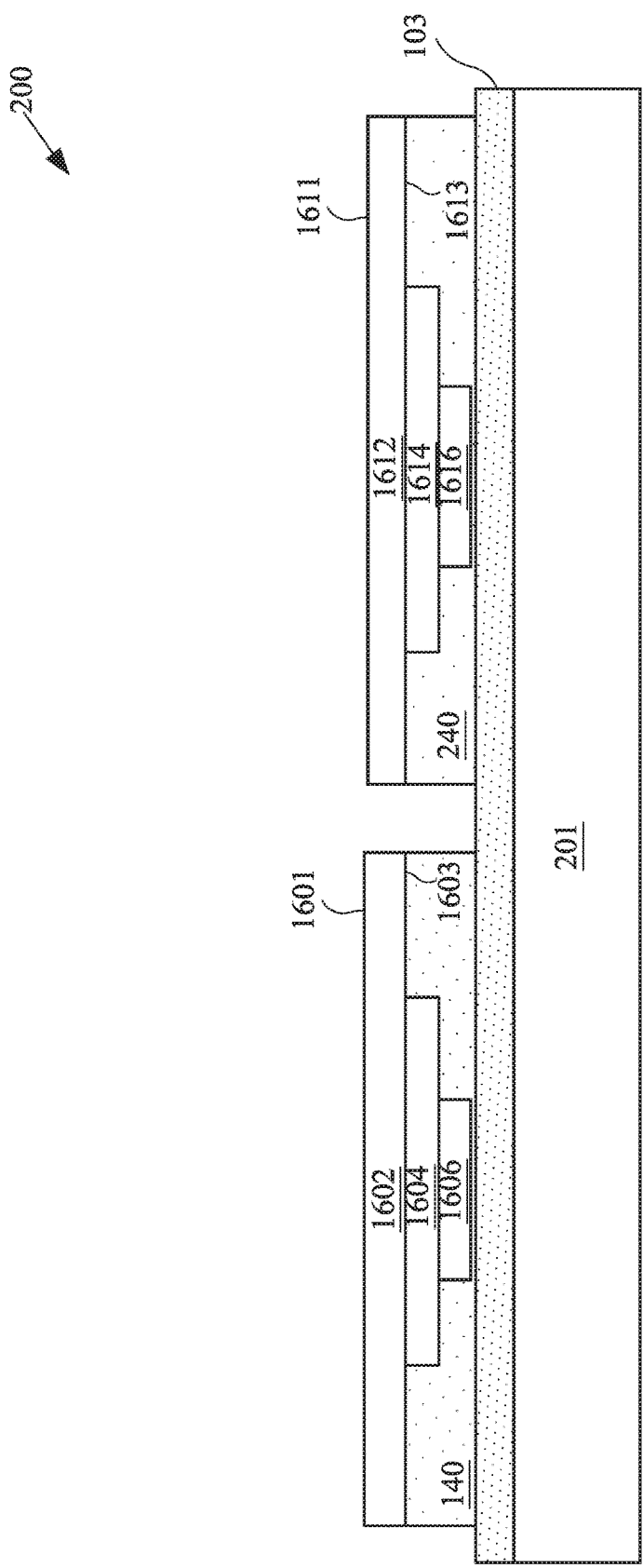

FIG. 16 illustrates a cross sectional view of the semiconductor device shown in FIG. 15 after a first top package and a second top package are mounted on the carrier in accordance with various embodiments of the present disclosure. The first top package 140 and the second top package 240 are picked and placed on the carrier 201. As shown in FIG. 16, each top package comprises a plurality of stacked dies. For example, the first top package 140 comprises a first semiconductor die 1602, a second semiconductor die 1604 and a third semiconductor die 1606. In some embodiments, the semiconductor dies 1602, 1604 and 1606 are dynamic random-access memory (DRAM) semiconductor devices.

The first semiconductor die 1602 comprises a first side 1601 and a second side 1603. The transistors of the first semiconductor die 1602 are formed adjacent to the second side 1603. In other words, the second side 1603 is the front side of the first semiconductor die 1602; the first side 1601 is the backside of the first semiconductor die 1602. Throughout the description, the first side 1601 is alternatively referred to as the backside and the second side 1603 is alternatively referred to as the front side.

In some embodiments, the backside of the second semiconductor die 1604 is in direct contact with the front side of the first semiconductor die 1602. The backside of the third semiconductor die 1606 is in direct contact with the front side of the second semiconductor die 1604.

The second top package 240 comprises a fourth semiconductor die 1612, a fifth semiconductor die 1614 and a sixth semiconductor die 1616. The side 1613 is the front side of the fourth semiconductor die 1612 and the side 1611 is the backside of the fourth semiconductor die 1612. In some embodiments, the backside of the fifth semiconductor die 1614 is in direct contact with the front side of the fourth semiconductor die 1612. The backside of the sixth semiconductor die 1616 is in direct contact with the front side of the fifth semiconductor die 1614. It should be noted that while FIG. 16 illustrates three semiconductor dies in each top package, the top packages may accommodate any number of semiconductor dies.

Figure 17:
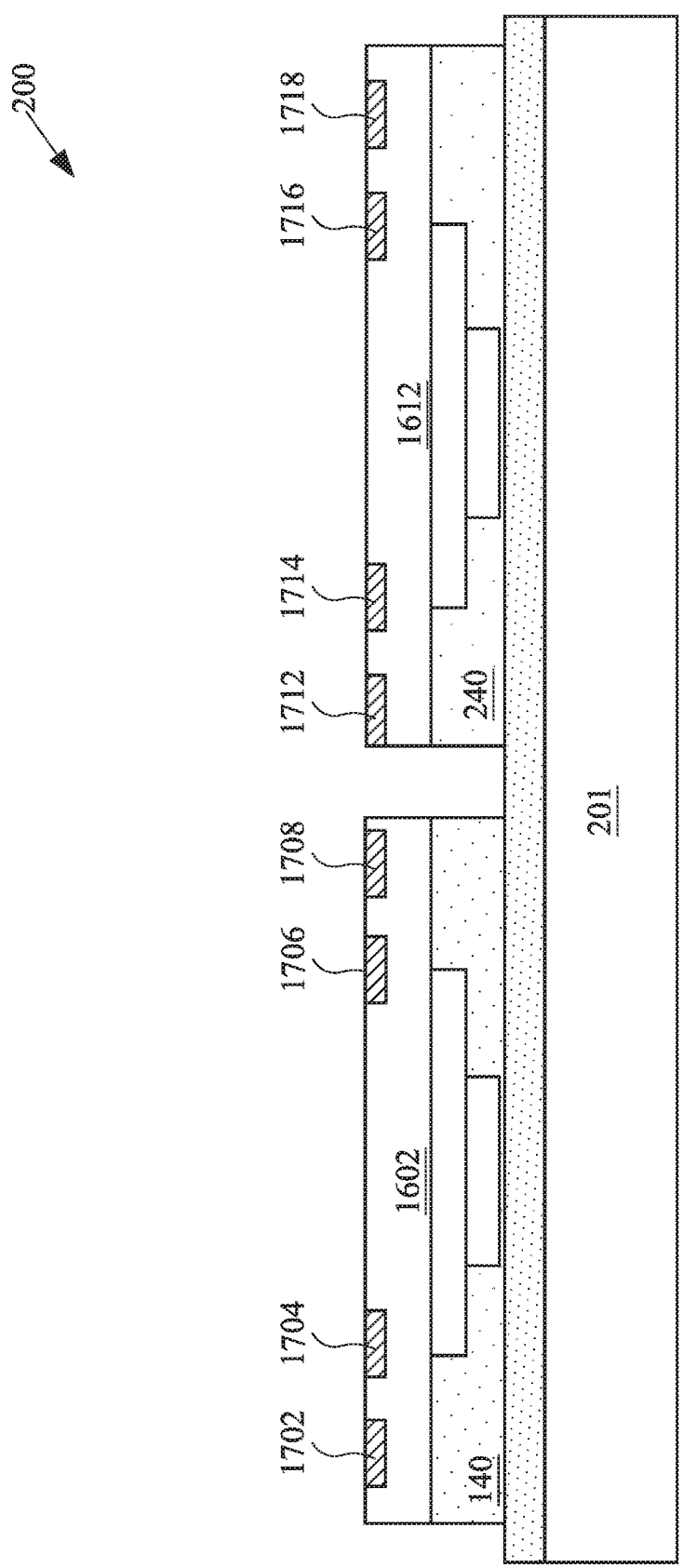

FIG. 17 illustrates another cross sectional view of the semiconductor device shown in FIG. 15 after a first top package and a second top package are mounted on the carrier in accordance with various embodiments of the present disclosure. The top packages 140 and 240 may comprise a plurality of contact pads. In some embodiments, the contact pads may protrude over the top surfaces of the top packages 140 and 240. Alternatively, the contact pads may be embedded in the top packages. As shown in FIG. 17, contact pads 1702, 1704, 1706 and 1708 are embedded in the top package 140. More particularly, the top surfaces of the contact pads 1702, 1704, 1706 and 1708 are level with the backside of the semiconductor die 1602. Likewise, contact pads 1712, 1714, 1716 and 1718 are embedded in the top package 240.

Figure 18:
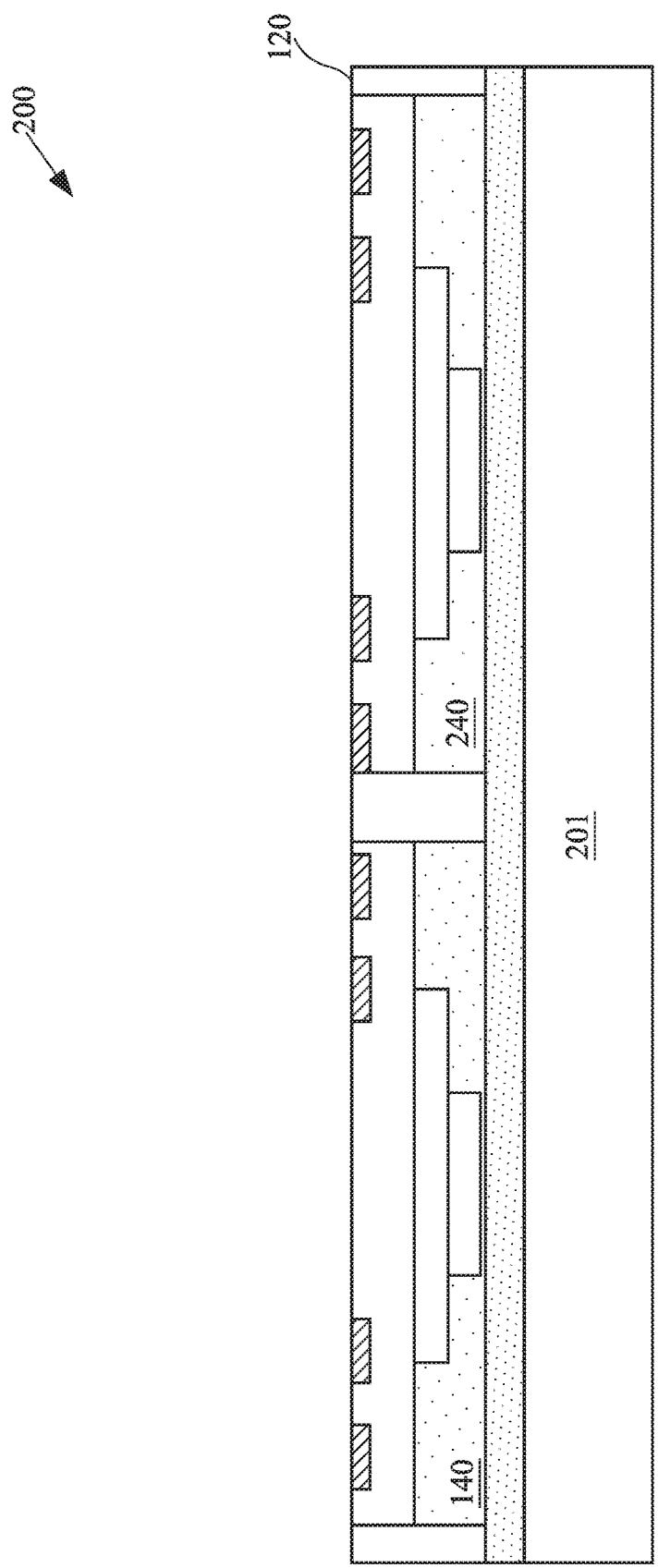
Figure 19:
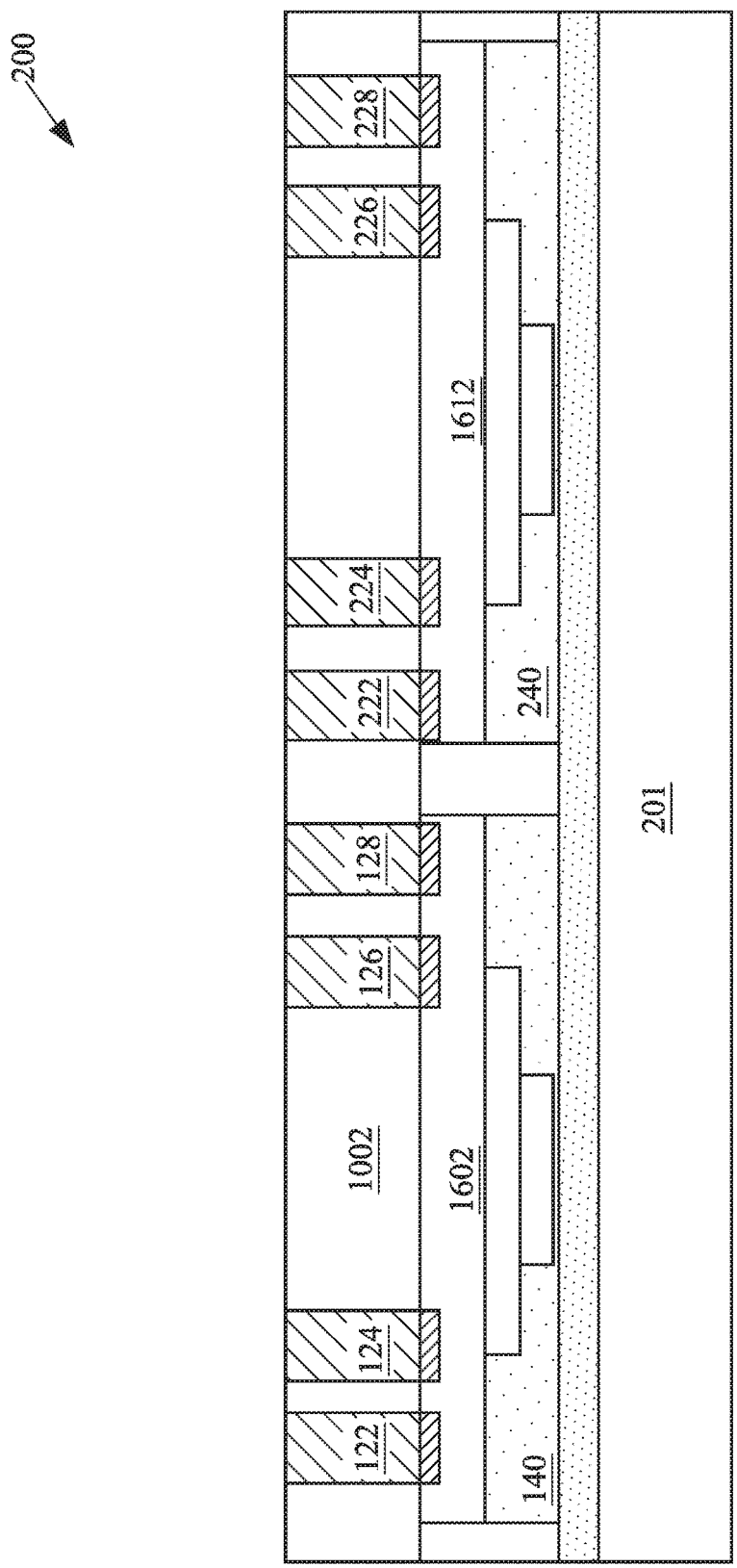

FIG. 19 illustrates a cross sectional view of the semiconductor device shown in FIG. 18 after a plurality of vias have been formed in accordance with various embodiments of the present disclosure. The via formation process of FIG. 19 is similar to that shown in FIG. 5 except that the vias are formed on the backsides of the semiconductor dies 1602 and 1612. As shown in FIG. 19, the bottom surfaces of vias 122, 124, 126 and 128 are level with the backside of the semiconductor die 1602. Likewise, the bottom surfaces of vias 222, 224, 226 and 228 are level with the backside of the semiconductor die 1612.

Figure 20:
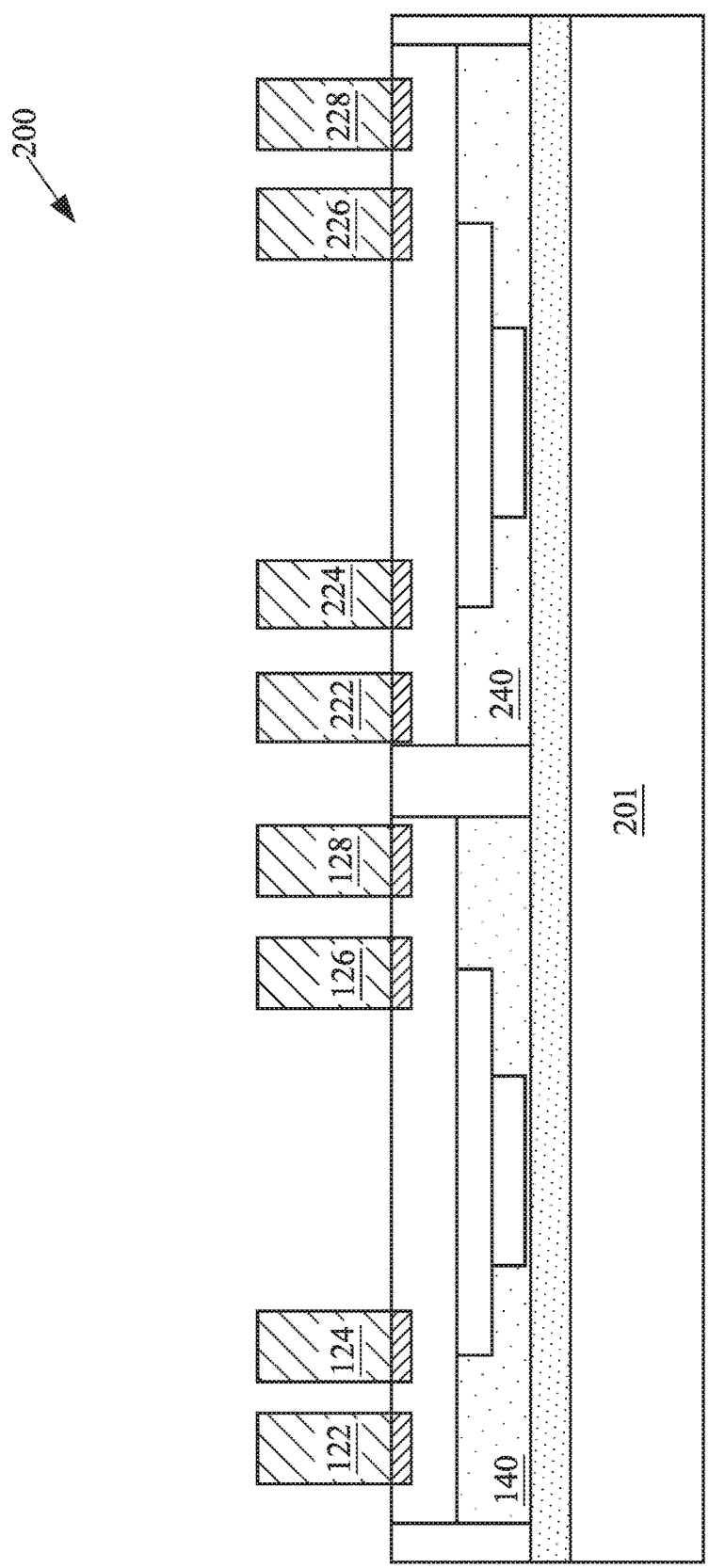
Figure 21:
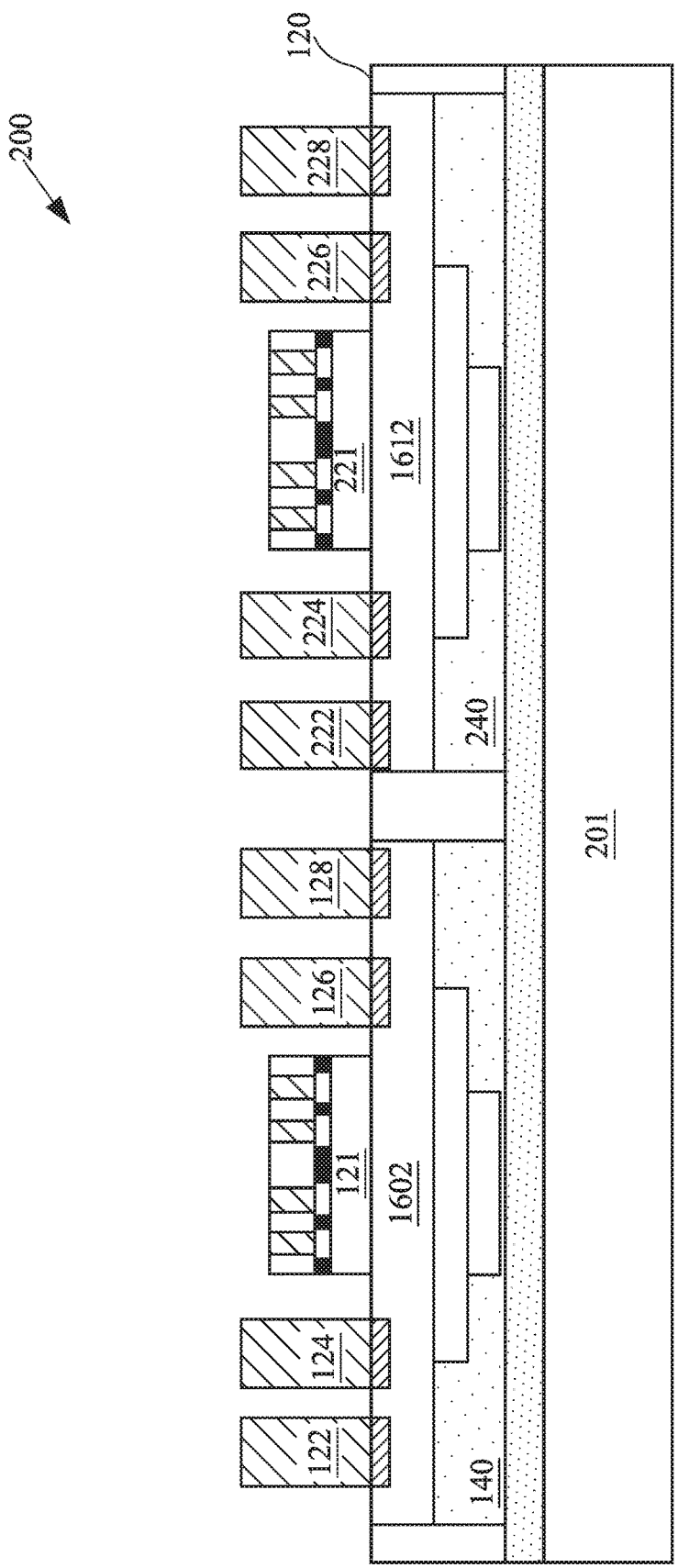
Figure 22:
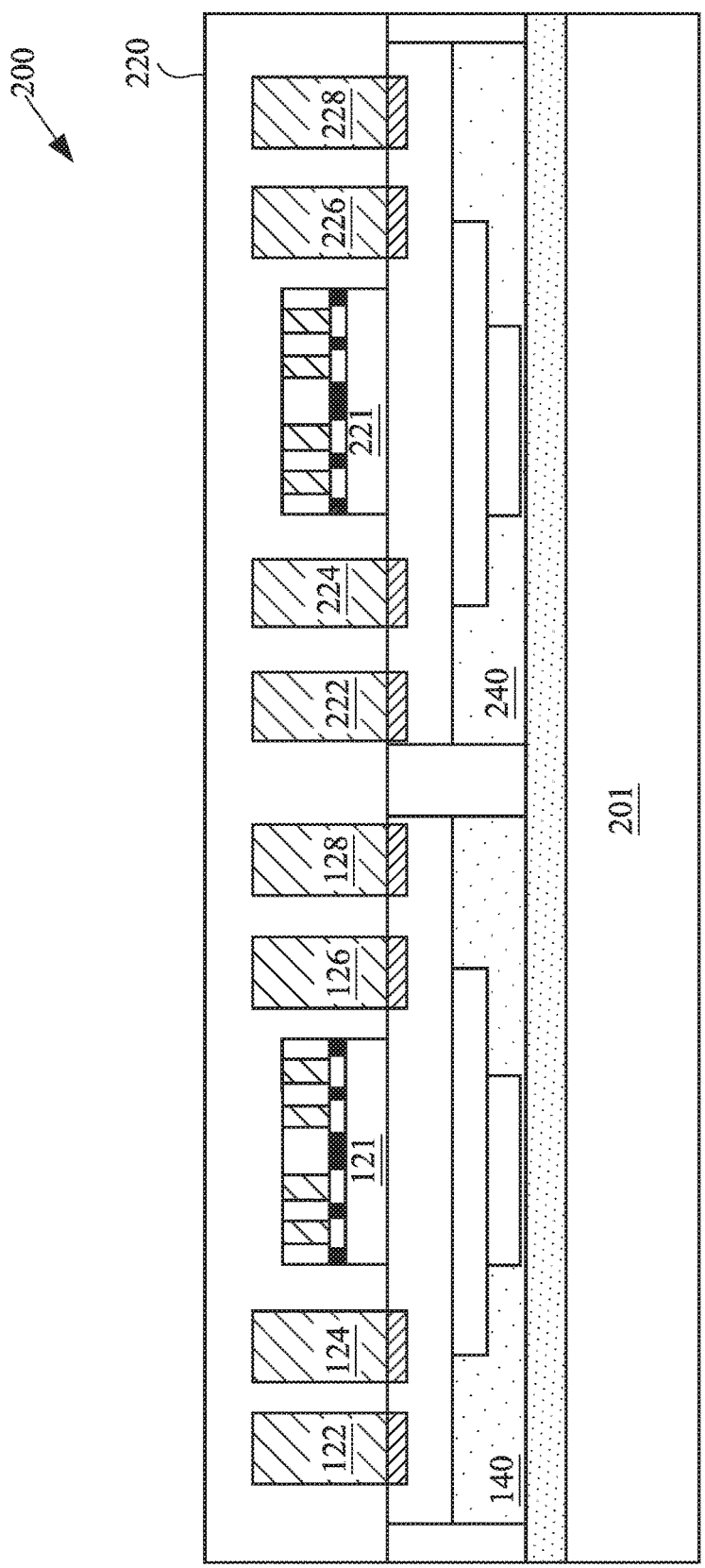
Figure 23:
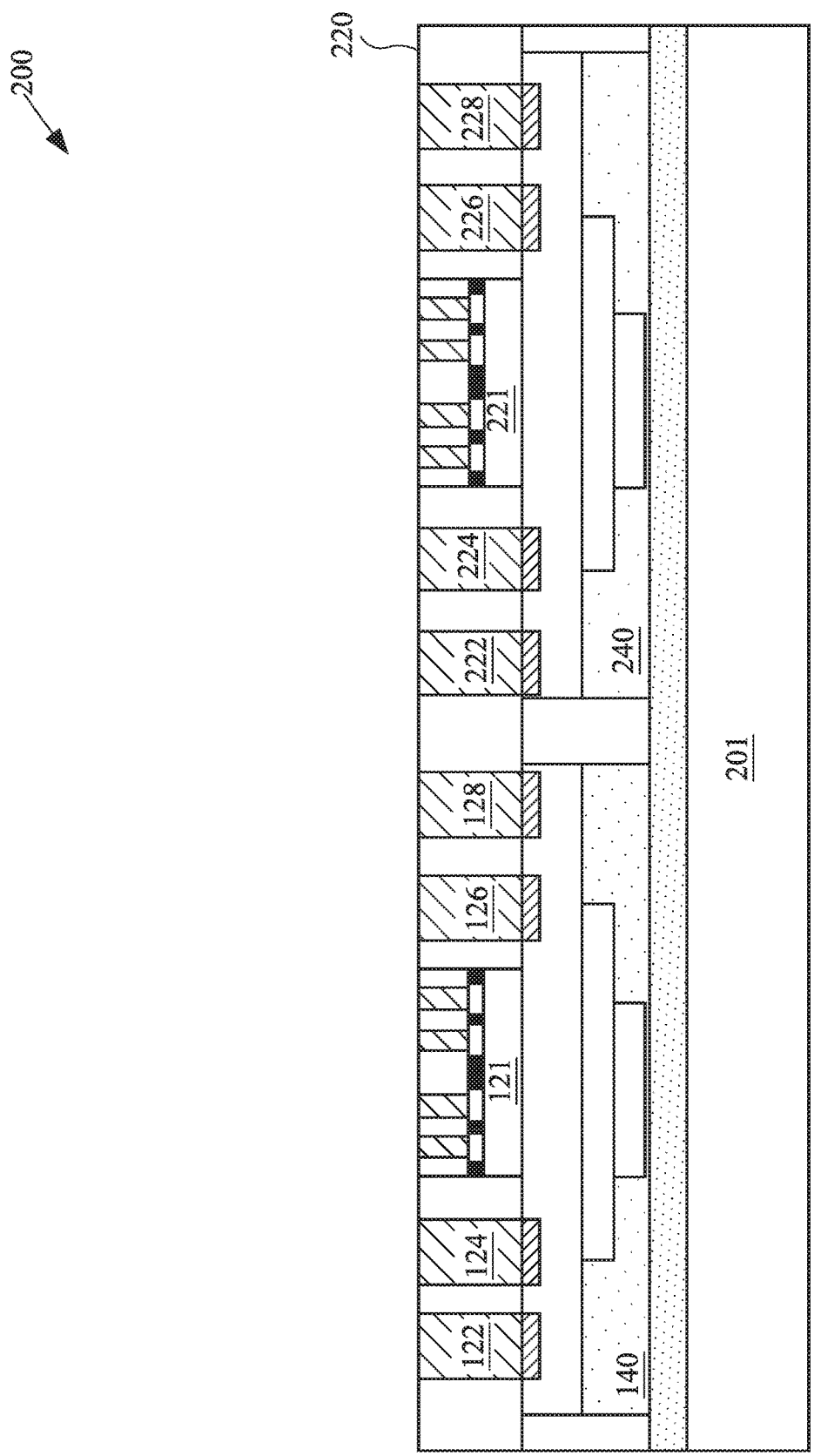
Figure 24:
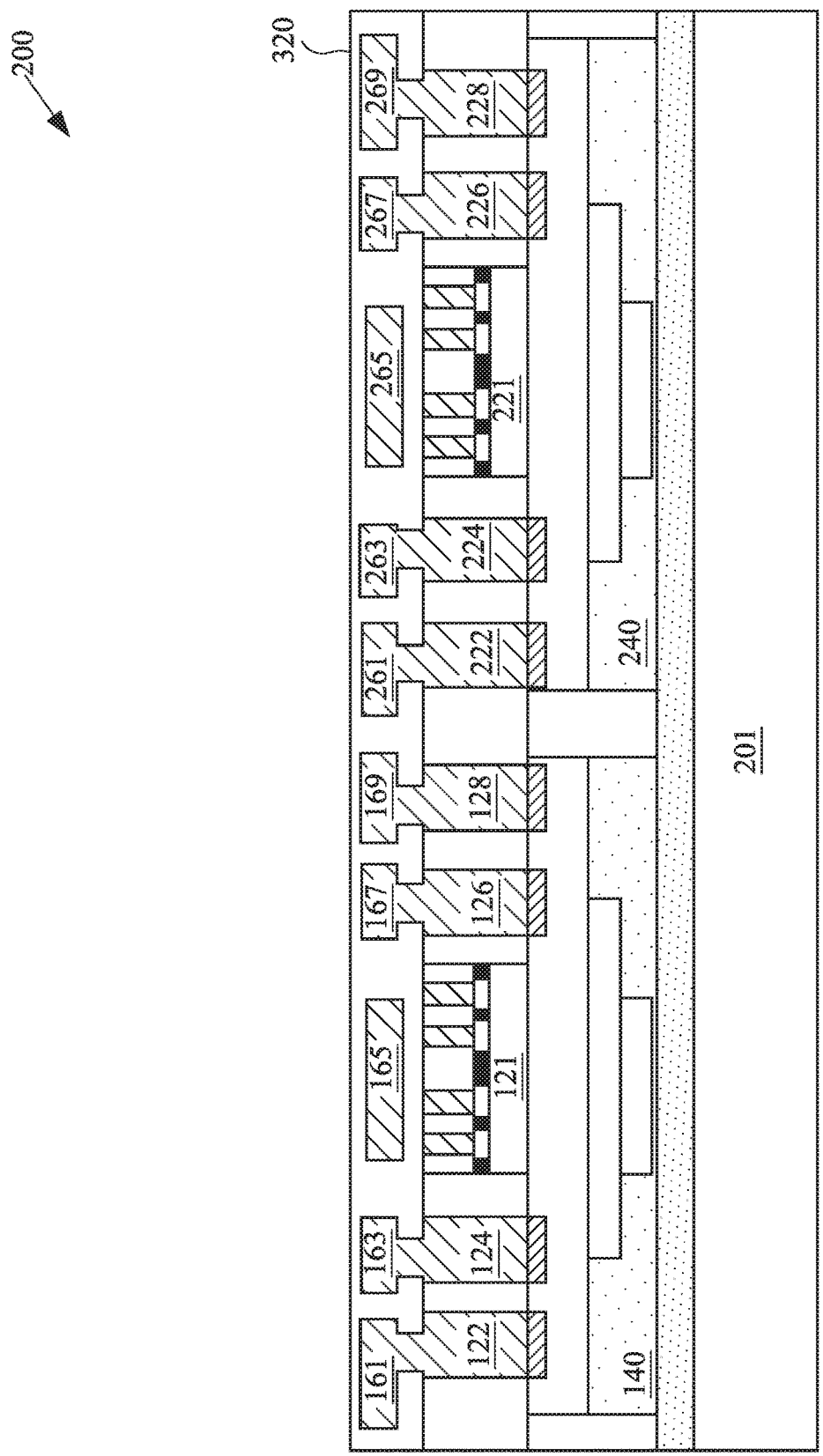
Figure 25:
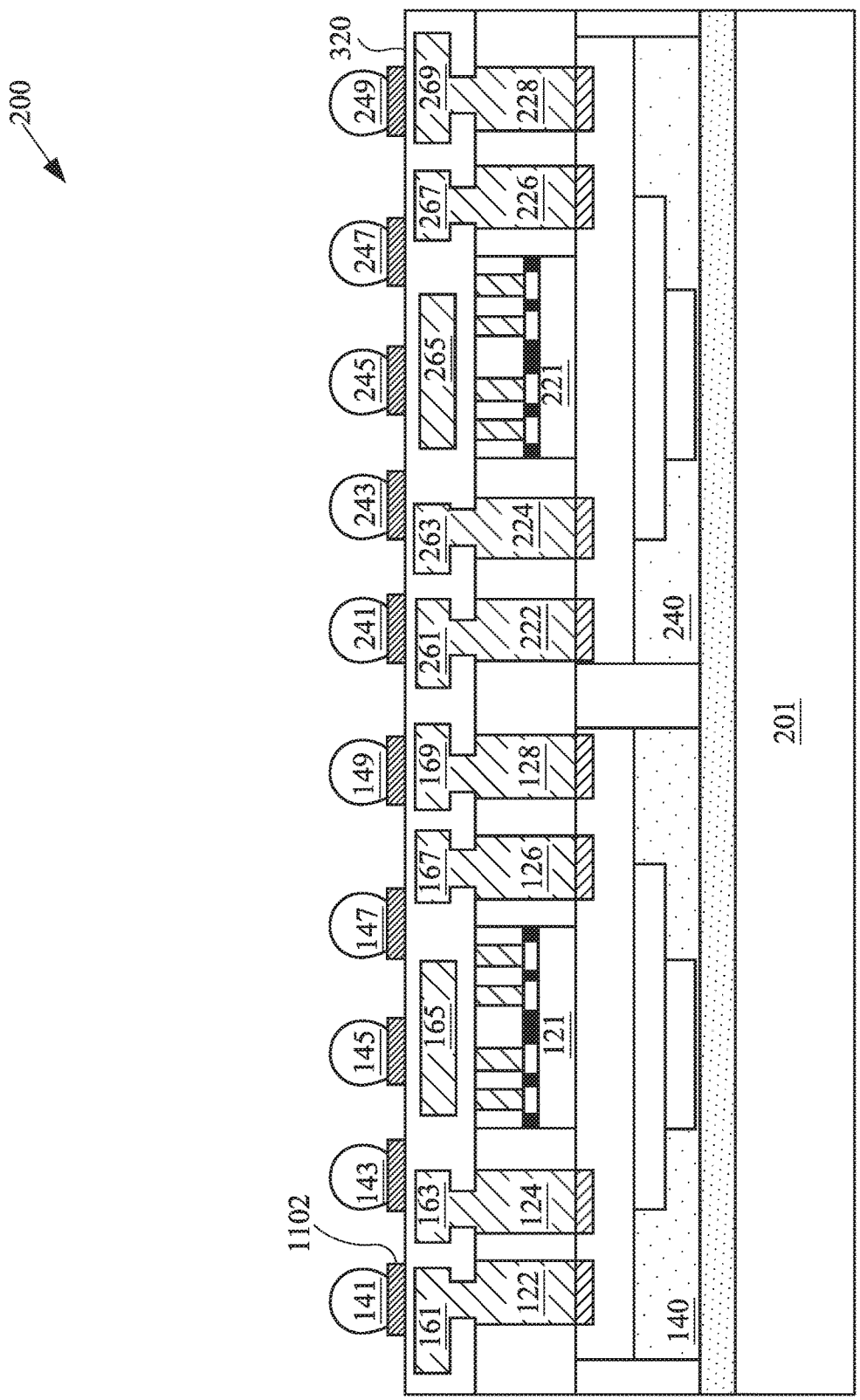
Figure 26:
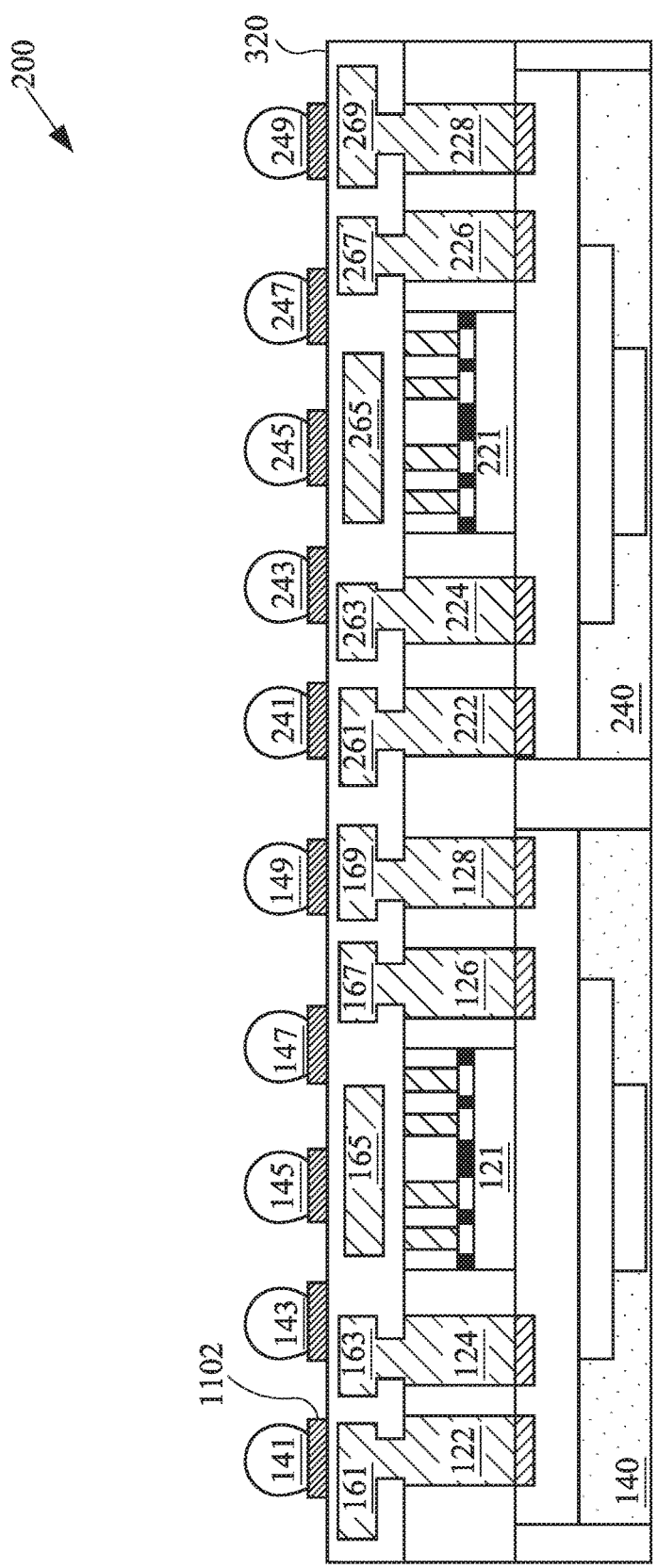
Figure 27:
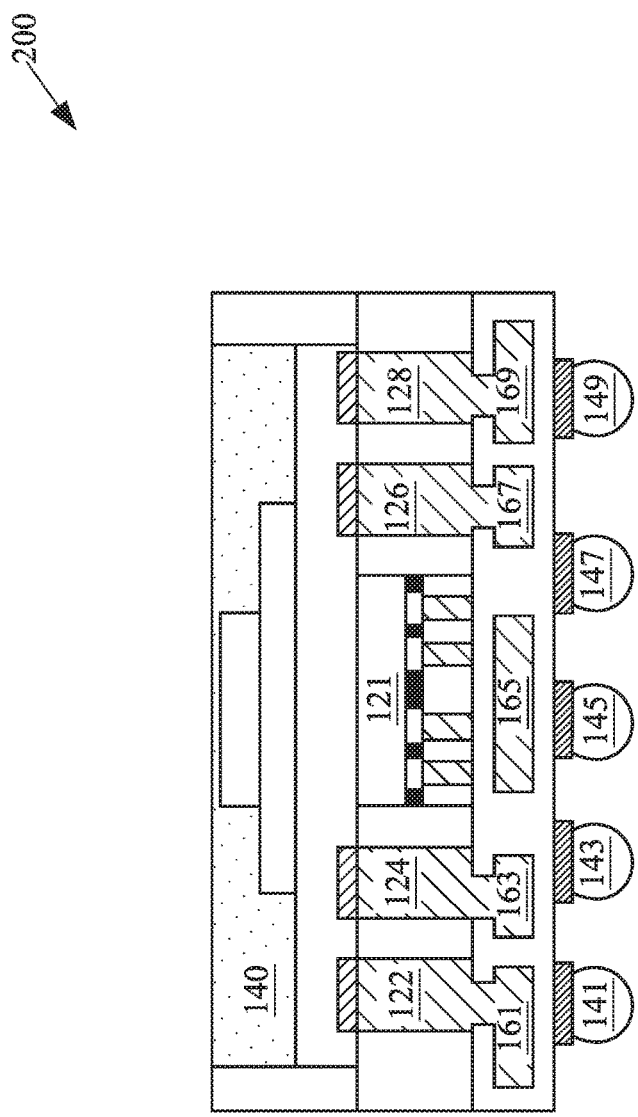

FIG. 21 illustrates a cross sectional view of the semiconductor device shown in FIG. 20 after a first semiconductor die and a second semiconductor die are mounted on the first molding compound layer in accordance with various embodiments of the present disclosure. Both the first semiconductor die 121 and the second semiconductor die 221 comprise a substrate and a plurality of interconnect structures formed over the substrate. The first semiconductor die 121 and the second semiconductor die 221 are picked and placed on the backsides of the semiconductor dies 1602 and 1612 respectively as shown in FIG. 21.

Figure 28:
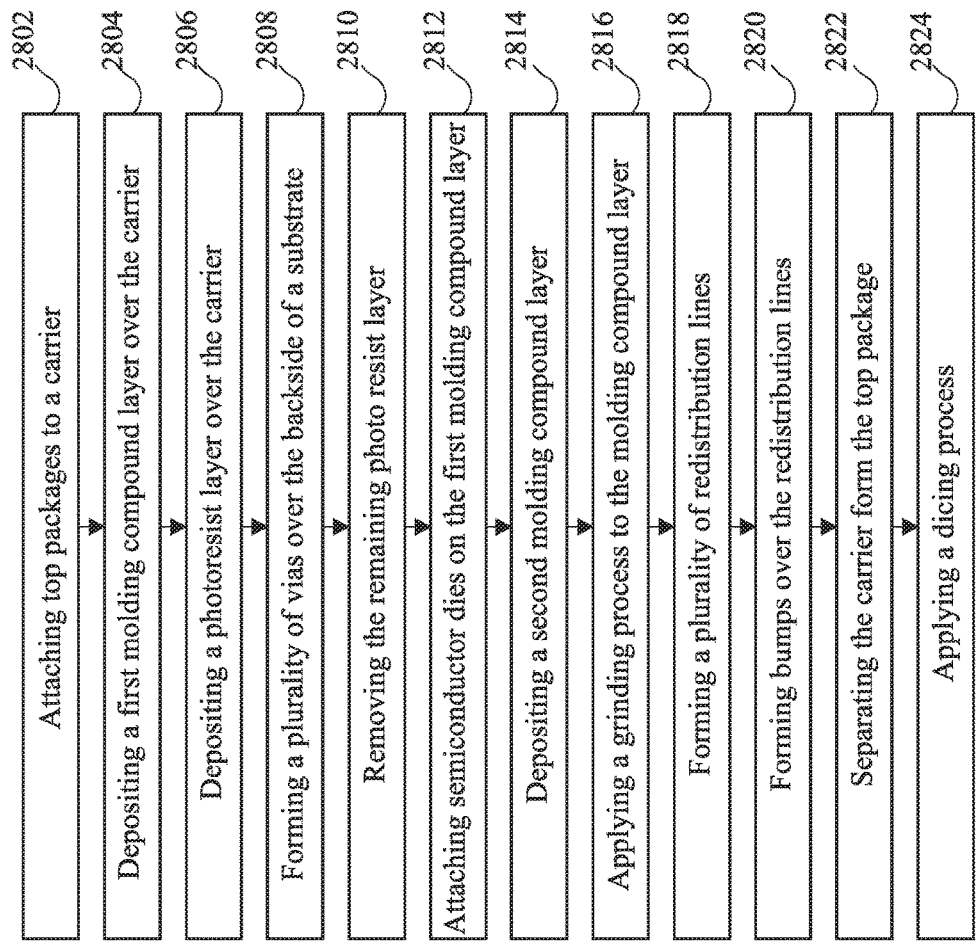
FIG. 28 illustrates a flow chart of a method for forming the semiconductor device shown in FIGS. 15-27 in accordance with various embodiments of the present disclosure.

FIG. 28 illustrates a flow chart of a method for forming the semiconductor device shown in FIGS. 15-27 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 28 may added, removed, replaced, rearranged and repeated. The fabrication steps in FIG. 28 are similar to the steps shown in FIG. 14 except that step 2808 is different. More particularly, the via are formed on the backside of a semiconductor die of the top package.

In accordance with an embodiment, a method comprises attaching a first semiconductor package on a carrier, wherein the first semiconductor package comprises a plurality of stacked semiconductor dies and a plurality of contact pads, depositing a first molding compound layer over the carrier, wherein the first semiconductor package is embedded in the first molding compound layer, forming a plurality of vias over the plurality of contact pads, attaching a semiconductor die on the first molding compound layer, depositing a second molding compound layer over the carrier, wherein the semiconductor die and the plurality of vias are embedded in the second molding compound layer, forming an interconnect structure over the second molding compound layer and forming a plurality of bumps over the interconnect structure.

In accordance with an embodiment, a device comprises a top package embedded in a first molding compound layer, a bottom package comprising an interconnect structure and a second molding compound layer formed between the first molding compound layer and the bottom package, wherein a semiconductor die and a plurality of through vias are embedded in the second molding compound layer, and wherein the top package comprises a contact pad in direct contact with a through via in the second molding compound layer.

In accordance with an embodiment, a method comprises attaching a first semiconductor package and a second semiconductor package on a carrier, depositing a first molding compound layer over the carrier, wherein the first semiconductor package and the second semiconductor package are embedded in the first molding compound layer, forming a plurality of first vias over the first semiconductor package and a plurality of second vias over the second semiconductor package, attaching a first semiconductor die and a second semiconductor die on the first molding compound layer, wherein the first semiconductor die is over the first semiconductor package and between two first vias, and second semiconductor die is over the second semiconductor package and between two second vias, depositing a second molding compound layer over the carrier, wherein the first semiconductor die, the second semiconductor die, the plurality of first vias and the plurality of second vias are embedded in the second molding compound layer, forming an interconnect structure over the second molding compound layer, forming a plurality of bumps over the interconnect structure and performing a dicing process to form two package-on-package structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    attaching a first semiconductor package on a carrier, wherein the first semiconductor package comprises a plurality of stacked semiconductor dies and a plurality of contact pads;

depositing a first molding compound layer over the carrier, wherein the first semiconductor package is embedded in the first molding compound layer;
forming a plurality of through vias over the plurality of contact pads;
attaching a semiconductor die on the first semiconductor package;
depositing a second molding compound layer over the carrier, wherein the semiconductor die and the plurality of through vias are embedded in the second molding compound layer;
planarizing the second molding compound layer such that top surfaces of the second molding compound layer, the plurality of through vias, and the semiconductor die are level;
forming an interconnect structure over the second molding compound layer; and
forming a plurality of bumps over the interconnect structure.

2. The method of claim 1, further comprising:
after the step of depositing the second molding compound layer over the carrier, applying a grinding process to the second molding compound layer until a top surface of the semiconductor die is exposed.

3. The method of claim 2, further comprising:
forming a plurality of redistribution lines in a dielectric layer, wherein the plurality of redistribution lines and the dielectric layer form the interconnect structure.

4. The method of claim 1, further comprising:
forming a plurality of first redistribution lines in a first dielectric layer; and
forming a plurality of second redistribution lines in a second dielectric layer over the first dielectric layer, wherein the plurality of first redistribution lines, the first dielectric layer, the plurality of second redistribution lines, the second dielectric layer form the interconnect structure.

5. The method of claim 1, further comprising:
forming a plurality of under bump metallization structures over the interconnect structure; and
forming the plurality of bumps on the plurality of under bump metallization structures.

6. The method of claim 1, further comprising:
forming a plurality of interconnect vias in the interconnect structure, wherein surfaces of the interconnect vias are in direct contact with respective first surfaces of the through vias.

7. The method of claim 6, wherein:
second surfaces of the through vias are in direct contact with respective ones of the plurality of contact pads, and wherein the second surfaces of the through vias are each level with a backside of the semiconductor die.

8. The method of claim 1, further comprising:
after the step of forming a plurality of bumps over the interconnect structure, separating the carrier from the first semiconductor package.

9. A method comprising:
attaching a first semiconductor package and a second semiconductor package on a carrier;
depositing a first molding compound layer over the carrier, wherein the first semiconductor package and the second semiconductor package are embedded in the first molding compound layer;
forming a plurality of first vias over the first semiconductor package and a plurality of second vias over the second semiconductor package;
attaching a first semiconductor die and a second semiconductor die over the first semiconductor package and the second semiconductor package respectively, wherein the first semiconductor die is over the first semiconductor package and between two first vias, and second semiconductor die is over the second semiconductor package and between two second vias;
depositing a second molding compound layer over the carrier, wherein the first semiconductor die, the second semiconductor die, the plurality of first vias and the plurality of second vias are embedded in the second molding compound layer;
forming an interconnect structure over the second molding compound layer;
forming a plurality of bumps over the interconnect structure; and
performing a dicing process to form two package-on-package structures.

10. The method of claim 9, further comprising:
after the step of depositing the first molding compound layer over the carrier, top surfaces of the first semiconductor package and the second semiconductor package are level with a top surface of the first molding compound layer.

11. The method of claim 9, further comprising:
depositing the first molding compound layer over the carrier through an expose molding process.

12. The method of claim 9, further comprising:
depositing a photoresist layer over the first molding compound layer;
patterning the photoresist layer to form a plurality of openings; and
filling the plurality of openings with a conductive material.

13. The method of claim 9, wherein:
the first vias are formed on a backside of a first semiconductor die in the first semiconductor package; and
the second vias are formed on a backside of a second semiconductor die in the second semiconductor package.

14. A method comprising:
attaching a first semiconductor package on a carrier, wherein the first semiconductor package comprises a first die stacked on a second die, and a plurality of contact pads, wherein:
the first die is on a front side of the second die;
a width of the second die is greater than a width of the first die; and
the plurality of contact pads are embedded in the second die and top surfaces of the plurality of contact pads are substantially level with a surface of a backside of the second die;
depositing a first molding compound layer over the carrier, wherein the first semiconductor package is embedded in the first molding compound layer;
forming a plurality of vias over the plurality of contact pads;
attaching a semiconductor die on the first semiconductor package; and
depositing a second molding compound layer over the carrier, wherein the semiconductor die and the plurality of vias are embedded in the second molding compound layer.

15. The method of claim 14, further comprising:
depositing the first molding compound layer over the carrier through an expose molding process, wherein a top surface of the first molding compound layer is substantially level with a top surface of the first semiconductor package after the expose molding process finishes.

16. The method of claim 14, further comprising:
forming the plurality of vias over the plurality of contact pads, wherein bottom surfaces of the plurality of vias are in contact with their respective top surfaces of the plurality of contact pads.

17. The method of claim 14, further comprising:
forming an interconnect structure over the second molding compound layer; and
forming a plurality of bumps over the interconnect structure.

18. The method of claim 17, further comprising:
after the step of forming the plurality of bumps over the interconnect structure, separating the carrier from the first semiconductor package.

19. The method of claim 14, wherein:
a first contact pad, a second contact pad, a third contact pad and a fourth contact pad are formed adjacent to the backside of the second die, and wherein:
the first contact pad is between a first sidewall of the first die and a first sidewall of the second die;
a center of the second contact pad is vertically aligned with the first sidewall of the first die;
a center of the third contact pad is vertically aligned with a second sidewall of the first die; and
the fourth contact pad is between the second sidewall of the first die and a second sidewall of the second die.

20. The method of claim 14, further comprising:
after the step of depositing the second molding compound layer over the carrier, applying a grinding process to the second molding compound layer until a top surface of the semiconductor die is exposed.

* * * * *